(12) United States Patent
Yamaguchi

(10) Patent No.: US 7,787,543 B2
(45) Date of Patent: Aug. 31, 2010

(54) PULSE PATTERN GENERATOR AND COMMUNICATION DEVICE EVALUATION SYSTEM UTILIZING THE SAME

(75) Inventor: Kazuhiko Yamaguchi, Atsugi (JP)

(73) Assignee: Anritsu Corporation, Atsugi-Shi (JP)

( * ) Notice: Subject to any disclaimer, the term of this patent is extended or adjusted under 35 U.S.C. 154(b) by 1166 days.

(21) Appl. No.: 10/566,734

(22) PCT Filed: Jul. 1, 2005

(86) PCT No.: PCT/JP2005/012241

§ 371 (c)(1),
(2), (4) Date: Feb. 1, 2006

(87) PCT Pub. No.: WO2006/004057

PCT Pub. Date: Jan. 12, 2006

(65) Prior Publication Data

US 2007/0121713 A1    May 31, 2007

(30) Foreign Application Priority Data

Jul. 5, 2004    (JP)    ............................. 2004-198071

(51) Int. Cl.
*H04B 14/04*    (2006.01)
(52) U.S. Cl. ........................ 375/243; 375/254; 375/371; 375/377
(58) Field of Classification Search ................. 375/376, 375/377, 368, 224, 286, 288
See application file for complete search history.

(56) References Cited

U.S. PATENT DOCUMENTS 3,731,199 A * 5/1973 Tazaki et al. ................. 375/288

(Continued)

FOREIGN PATENT DOCUMENTS

JP    61-053839 A    3/1986

(Continued)

OTHER PUBLICATIONS

IEEE Draft P802.3ae/D5.0; Supplement to Carrier Sense Multiple Access with Collision Detection (CSMA/CD) Access Method & Physical Layer Specifications; "Media Access Control (MAC) Parameters, Physical Layer, and Management Parameters for 10 Gb/s Operation" ; May 1, 2002; pp. 477-481.

(Continued)

*Primary Examiner*—Chieh M Fan
*Assistant Examiner*—Qutbuddin Ghulamali
(74) *Attorney, Agent, or Firm*—Frishauf, Holtz, Goodman & Chick, P.C.

(57) ABSTRACT

A pulse pattern generator (11) has a pulse generating unit (12) and a lowpass filter (14), and the pulse generating unit (12) includes an amplitude-value setting unit (13, 13*a*). The pulse generating unit (12) generates a pulse signal formed in a step-like wave in which at least one of rise and fall of a signal is changed in a step-like manner. The lowpass filter (14) smoothes the pulse signal generated by the pulse generating unit (11), and outputs a smoothed pulse signal. The amplitude-value setting unit (13, 13*a*) adjusts an amplitude value of a step-like wave that forms the pulse signal in order to set a shape of an eye waveform based on a setting value when an eye pattern of the output from the lowpass filter (14) is formed. The pulse pattern generator (11) can output the pulse signal having a desired pulse pattern having the predetermined eye closure from the lowpass filter (14).

12 Claims, 19 Drawing Sheets

U.S. PATENT DOCUMENTS

| | | | |
|---|---|---|---|
| 4,188,580 A * | 2/1980 | Nicolai et al. | 380/254 |
| 5,459,749 A * | 10/1995 | Park | 375/286 |
| 6,108,105 A * | 8/2000 | Takeuchi et al. | 358/1.2 |
| 6,111,532 A * | 8/2000 | Hirano et al. | 341/143 |
| 7,433,216 B2 * | 10/2008 | Romenesko | 363/132 |
| 2005/0267696 A1 * | 12/2005 | Yamaguchi et al. | 702/57 |
| 2007/0116474 A1 * | 5/2007 | Ono et al. | 398/140 |

FOREIGN PATENT DOCUMENTS

| | | |
|---|---|---|
| JP | 63-306745 A | 12/1988 |
| JP | 01-160237 A | 6/1989 |
| JP | 5-283988 A | 10/1993 |
| JP | 6-326890 A | 11/1994 |

OTHER PUBLICATIONS

Notification Concerning Transmittal of International Preliminary Report on Patentability, Chapter I of the Patent Cooperation Treaty, and Written Opinion of the International Searching Authority, dated Jan. 25, 2007, for PCT/JP2005/012241, 5 sheets.

English translation of a Japanese Office Action dated Apr. 14, 2009 issued in a counterpart Japanese Application No. 2006-519624.

English translation of a Japanese Office Action dated Apr. 14, 2009 issued in a counterpart Japanese Application No. 2006-519624.

* cited by examiner

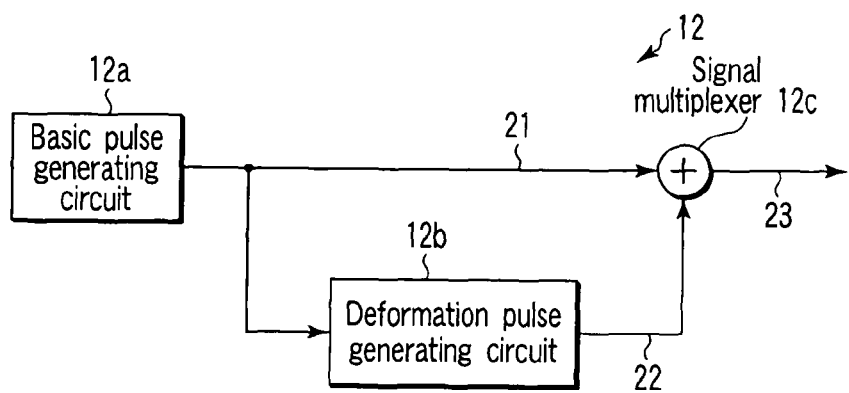
F I G. 2
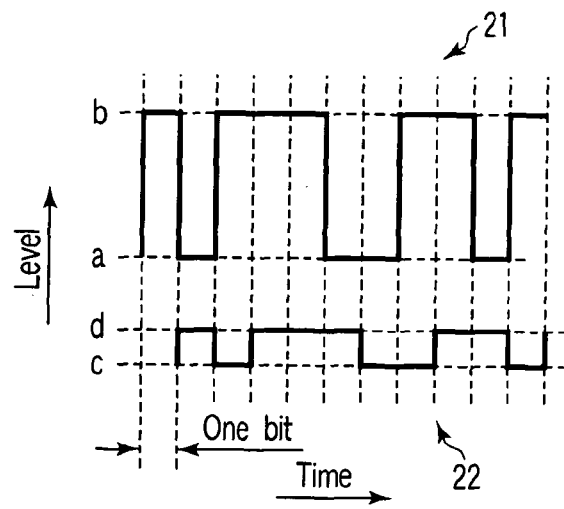
F I G. 3A
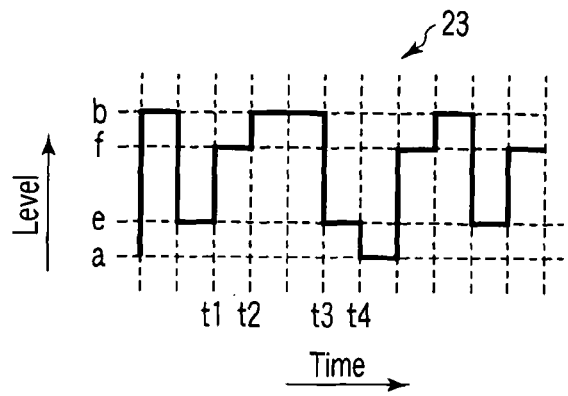
F I G. 3B

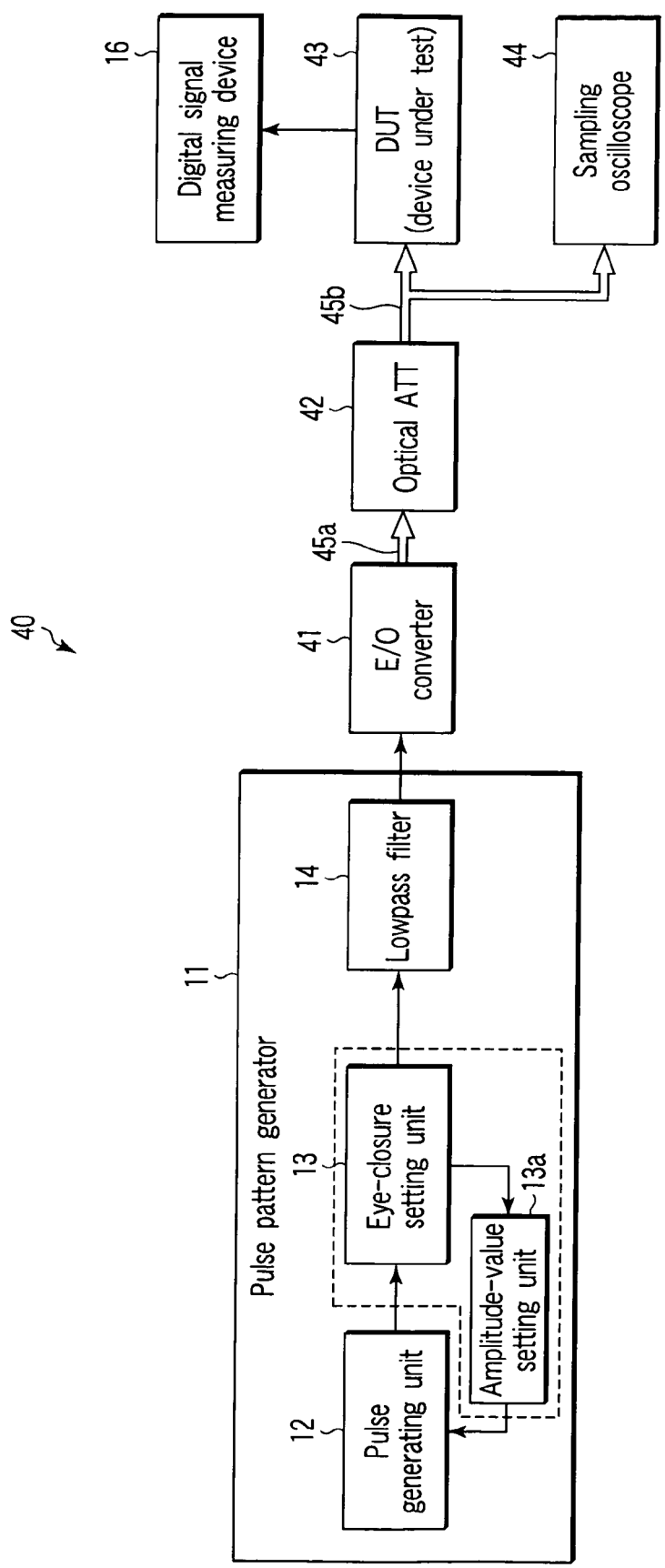
F I G. 9

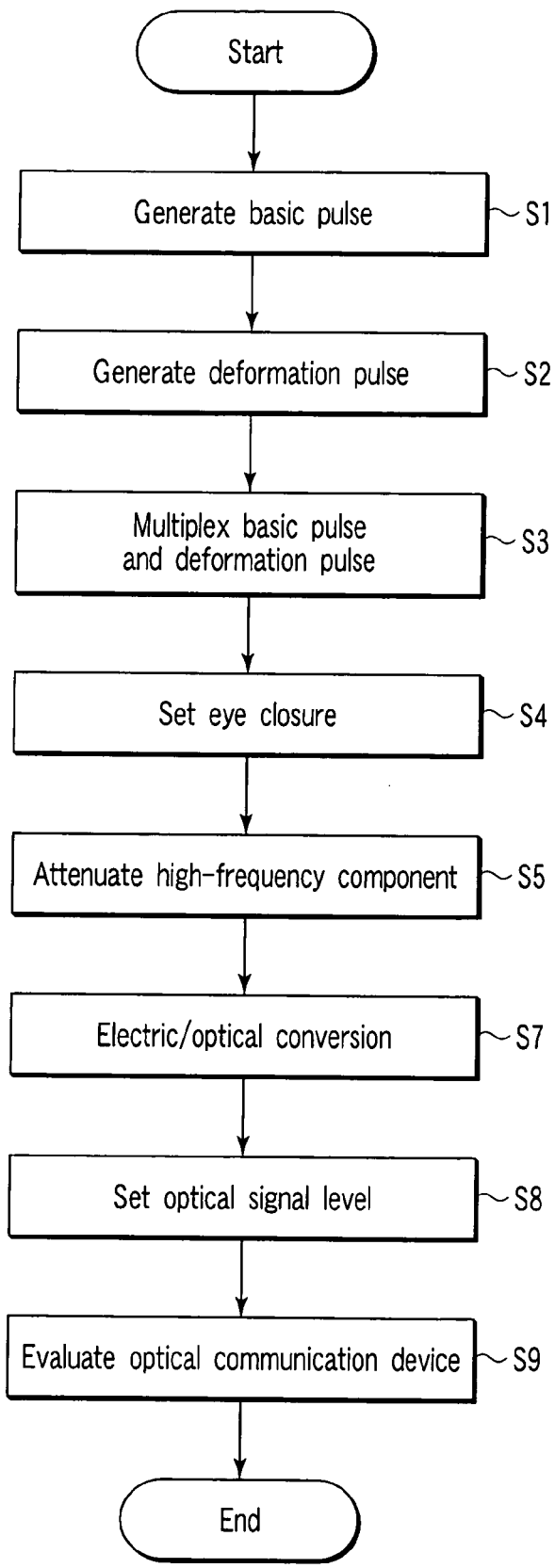
F I G. 10

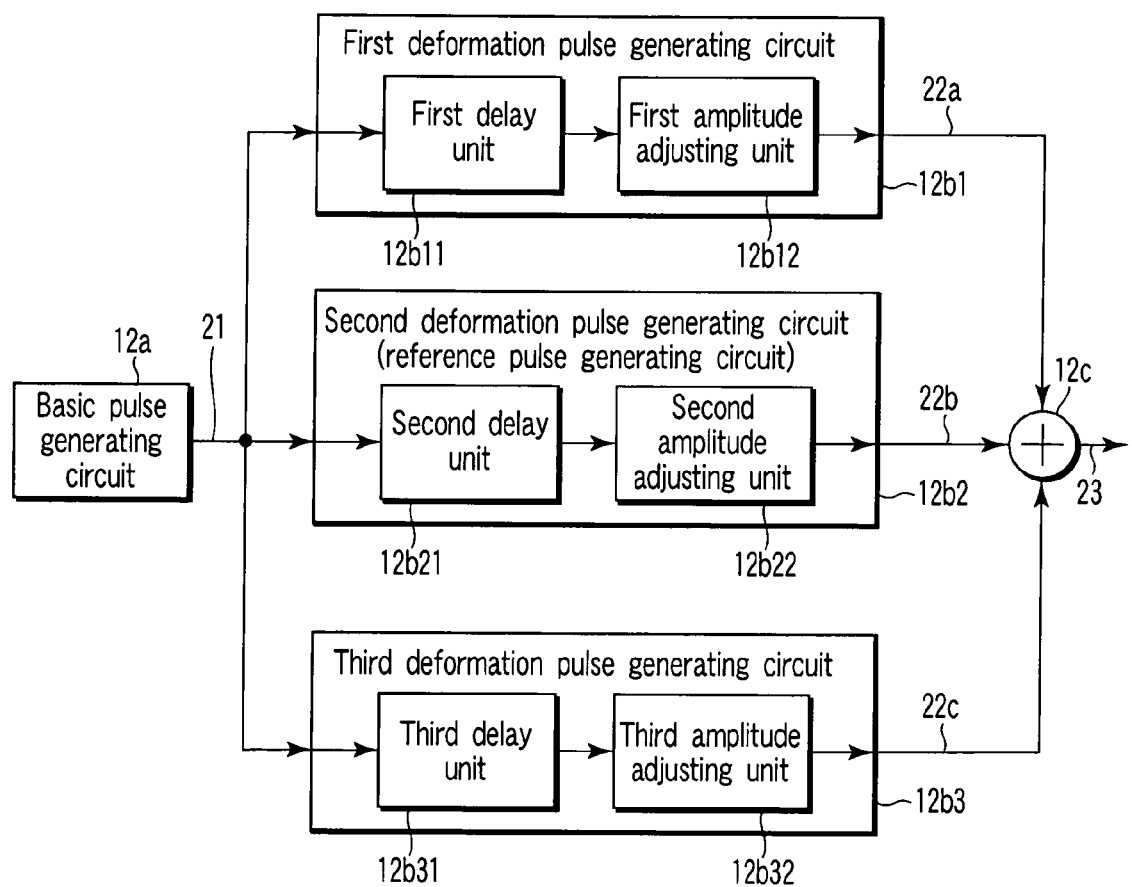
F I G. 11

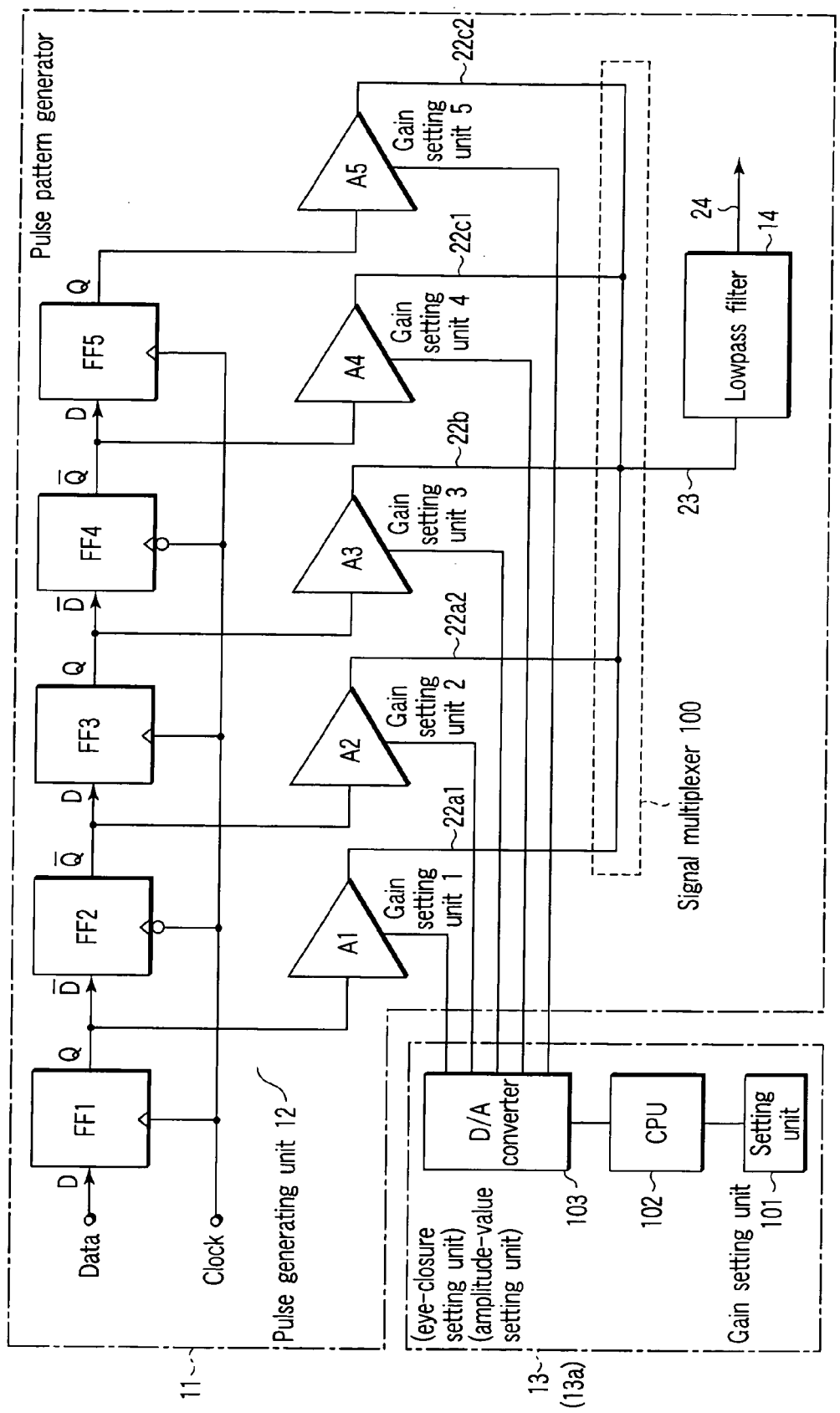
F I G. 17

PULSE PATTERN GENERATOR AND COMMUNICATION DEVICE EVALUATION SYSTEM UTILIZING THE SAME

This application is a U.S. National Phase Application under 35 USC 371 of International Application PCT/JP2005/012241 filed Jul. 1, 2005.

TECHNICAL FIELD

The present invention relates to a pulse pattern generator and a communication device evaluation system utilizing the same, and particularly, to a pulse pattern generator which generates a pulse signal having a desired pulse pattern for evaluating a communication device such as a telecommunication device and an optical communication device, and a communication device evaluation system utilizing the same.

BACKGROUND ART

As is well known, recently, demand for high-speed and large-capacity communication is increased as information communication represented by the Internet has rapidly grown.

The demand also causes expansion of broadband communication with a telecommunication system or an optical communication system utilizing optical fibers.

A digital communication method is adopted in the telecommunication system or the optical communication system, and a digital communication system is realized by transmitting and receiving data in which 1s and 0 s are combined.

Therefore, in the digital communication system, it is important that the pulse signal representing 1 or 0 is transmitted and received as fast as possible with high reliability.

An evaluation test, such as an error rate test, in which predetermined pulse signals are input, is performed in various communication devices constituting the telecommunication system or the optical communication system for realizing the digital communication system.

Accordingly, performance and reliability are ensured in various communication devices constituting the telecommunication system or the optical communication system.

Generally, characteristics of the pulse signal are defined by eye closure (eye opening degree) when an eye pattern is formed.

IEEE (Institute of Electrical and Electronics Engineers) defines the eye closure of the pulse signal used in evaluating various communication devices, and IEEE establishes a standard in which a test with the pulse signal having the defined eye closure is perform as a stress test (for example, see IEEE Draft P802 3ae/D5.0 May 1, 2002 pp. 477-481 FIG. 52-10).

Therefore, in the conventional evaluation system for various communication devices, in order to performed the stress test established by IEEE, a fourth order Bessel-Thomson filter is prepared besides a pulse pattern generator which generates a pulse signal having a desired pulse pattern, and filter characteristics of the fourth order Bessel-Thomson filter are adjusted, which generates the pulse signal having the predetermined eye closure pursuant to the eye closure standard of IEEE.

The stress test for various communication devices is performed with the pulse signal having the established eye closure generated in the above manner.

DISCLOSURE OF INVENTION

However, in the conventional evaluation system for the communication device, when the stress test for various communication devices having the different eye-closure standards is performed in a production line of the communication device, it is necessary to prepare the same number of fourth order Bessel-Thomson filters as the number of eye-closure standards besides the pulse pattern generator which generates the pulse signal having the desired pulse pattern.

It is also necessary that the eye closures are individually set by changing capacitance of a capacitor or inductance of a coil, which constitute the fourth order Bessel-Thomson filter, with a laser trimmer or the like.

It is necessary that an error rate is evaluated in each communication device based on the pulse signal having the set predetermined eye closure.

Accordingly, in the conventional evaluation system for the communication device, a stress-test process performed in the production line of the communication device becomes remarkably complicated, and therefore, there is a problem that productivity is decreased in the production line of the communication device.

In view of the foregoing, an object of the present invention is to provide a pulse pattern generator which is improved so as to generate the pulse signal having the desired pulse pattern having the predetermined eye closure set by the pulse pattern generator in itself, and a communication device evaluation system in which the productivity can be increased by utilizing the improved pulse pattern generator for the communication device evaluation system to simplify the evaluation test for the device under test when compared with the conventional evaluation system.

In order to achieve the above object, according to a first aspect of the present invention, there is provided a pulse pattern generator (11) comprising:

a pulse generating unit (12) which generates a pulse signal formed in a step-like wave, in which at least one of rise and fall of a signal having a predetermined change amplitude value is changed in a step-like manner in a predetermined bit string;

a lowpass filter (14) which smoothes the pulse signal formed in the step-like wave, the pulse signal being generated by the pulse generating unit (12), and outputs a smoothed pulse signal; and an amplitude-value setting unit (13, 13a) which adjusts an amplitude value of a step-like wave that forms the pulse signal based on a setting value, in order to set an eye waveform at a predetermined eye closure when an output from the lowpass filter (14) is eye-patterninged, wherein the pulse signal having a desired pulse pattern with the predetermined eye closure set by the amplitude-value setting unit (13, 13a) is configured to be output from the lowpass filter (14).

In order to achieve the above object, according to a second aspect of the present invention, there is provided a pulse pattern generator according to the first aspect, wherein the pulse generating unit (12) includes:

a basic pulse generating unit (12a) which generates a basic pulse signal having a predetermined amplitude value in a predetermined bit string;

a deformation pulse generating unit (12b) which generates a deformation pulse, the deformation pulse having an amplitude value different from the predetermined amplitude value of the basic pulse signal and having a phase different from the phase of the basic pulse signal, in a bit string identical to the bit string of the basic pulse signal generated by the basic pulse generating unit (12a); and a signal multiplexing unit (12c) which outputs the pulse signal formed in the step-like wave by multiplexing the basic pulse signal generated by the basic pulse generating unit (12*a*) and the deformation pulse signal generated by the deformation pulse generating unit (12*b*).

In order to achieve the above object, according to a third aspect of the present invention, there is provided a pulse pattern generator according to the first aspect, wherein the pulse generating unit (12) includes:

a basic pulse generating unit (12*a*) which generates a basic pulse signal having a predetermined amplitude value in a predetermined bit string;

a plurality of deformation pulse generating units (12*b*) which generate a plurality of deformation pulse signals having phases equal to or delayed from the phase of the basic pulse signal, in a bit string identical to the bit string of the basic pulse signal generated by the basic pulse generating unit (12*a*); and a signal multiplexing unit (12*c*) which outputs the pulse signal formed in the step-like wave by multiplexing the plurality of deformation pulse signals generated by the plurality of deformation pulse generating units (12*b*).

In order to achieve the above object, according to a fourth aspect of the present invention, there is provided a pulse pattern generator according to the third aspect, wherein the plurality of deformation pulse generating units (12*b*) include:

a first deformation pulse generating unit (12*b*1) which generates a first deformation pulse signal having a phase equal to or delayed from the phase of the basic pulse signal;

a second deformation pulse generating unit (12*b*2) which generates a second deformation pulse signal having a phase delayed by a predetermined amount from the phase of the first deformation pulse signal; and a third deformation pulse generating unit (12*b*3) which generates a third deformation pulse signal having a phase delayed by a predetermined amount from the phase of the second deformation pulse signal.

In order to achieve the above object, according to a fifth aspect of the present invention, there is provided a pulse pattern generator according to the third aspect, wherein the plurality of deformation pulse generating units (12*b*) include:

a first deformation pulse generating unit (12*b*1) which generates a first deformation pulse signal having a phase equal to or delayed from the phase of the basic pulse signal;

a second deformation pulse generating unit (12*b*2) which generates a second deformation pulse signal having a phase delayed by a predetermined amount from the phase of the first deformation pulse signal; and a third deformation pulse generating unit (12*b*3) which generates a third deformation pulse signal having a phase delayed by a predetermined amount from the phase of the second deformation pulse signal;

a fourth deformation pulse generating unit (12*b*2) which generates a fourth deformation pulse signal having a phase delayed by a predetermined amount from the phase of the third deformation pulse signal; and a fifth deformation pulse generating unit (12*b*3) which generates a fifth deformation pulse signal having a phase delayed by a predetermined amount from the phase of the fourth deformation pulse signal.

In order to achieve the above object, according to a sixth aspect of the present invention, there is provided a pulse pattern generator according to the first aspect, wherein the pulse generating unit (30) includes:

a basic pulse generating circuit (31*a*) which generates a binary pulse signal, the binary pulse signal generating circuit serving as the basic pulse generating circuit (12*a*);

a one-bit delay circuit (31*b*) which delays the binary pulse signal output from the binary pulse signal generating circuit (31*a*) by one bit, and a two-bit delay circuit (31*c*) which delays the binary pulse signal output from the binary pulse signal generating circuit (31*a*) by two bits, the one-bit delay circuit and two-bit delay circuit each serving as the deformation pulse generating circuit (12*b*); and a signal multiplexing unit (31*d*) which outputs an eight-level pulse signal (33) by multiplexing output signals of the binary pulse signal generating circuit (31*a*), the one-bit delay circuit (31*b*), and the two-bit delay circuit (31*c*).

In order to achieve the above object, according to a seventh aspect of the present invention, there is provided a pulse pattern generator according to the first aspect, wherein the pulse generating unit (12) comprises:

flip-flops (FF1, FF2, . . . ) cascade-connected in a plurality of stages serving as the basic pulse generating circuit (12*a*) and the deformation pulse generating circuit (12*b*), a first stage being set as a master while the stages subsequent to the first stage being set as a slave, data having a predetermined data frequency being supplied to a data terminal of the first stage, a clock having a frequency double the data frequency being commonly supplied to a clock terminal of each stage, thereby, when the output from an intermediate stage is set at a reference pulse signal (reference wave), the stage precedent to the intermediate stage outputs the predetermined number of first deformation pulse signals (negative phase deformation waves) having the phases leading the phase of the reference wave by a predetermined phase amount while the stage subsequent to the intermediate stage outputs the predetermined number of second deformation pulse signals (positive phase deformation waves) having the phases delayed from the phase of the reference wave by a predetermined phase amount;

amplifiers (A1, A2, . . . ) having a plurality of stages which receive outputs from each stage of the flip-flops (FF1, FF2, . . . ) cascade-connected in the plurality of stages, respectively; and a signal multiplexing unit (100) which outputs the pulse signal formed in the step-like wave by multiplexing the outputs from each stage of the amplifiers (A1, A2, . . . ) having the plurality of stages, and the amplitude-value setting unit (13, 13*a*) includes a gain setting unit (101, 102, 103) which sets gains at gain setting units (1, 2, . . . ) of the amplifiers (A1, A2, . . . ) having the plurality of stages such that a predetermined amplitude-value relationship is established among the reference pulse signal (reference wave), the first deformation pulse signal (negative phase deformation wave), and the second deformation pulse signal (positive phase deformation wave), in order that finally the output from the lowpass filter (14) has the desired eye closure.

In order to achieve the above object, according to an eighth aspect of the present invention, there is provided a communication device evaluation system utilizing a pulse pattern generator comprising:

a pulse pattern generator (11) comprising:

a pulse generating unit (12) which generates a pulse signal formed in a step-like wave, in which at least one of rise and fall of a signal having a predetermined change amplitude value is changed in a step-like manner in a predetermined bit string;

a lowpass filter (14) which smoothes the pulse signal formed in the step-like wave, the pulse signal being generated by the pulse generating unit (12), and outputs a smoothed pulse signal; and an amplitude-value setting unit (13, 13*a*) which adjusts an amplitude value of the step-like wave that forms the pulse signal based on a setting value, in order to set an eye waveform at a predetermined eye closure when an output from the lowpass filter (14) is eye-patterninged, wherein the pulse signal having a desired pulse pattern with the predetermined eye closure set by the amplitude-value setting unit (13, 13a) is configured to be output from the lowpass filter (14), and a characteristic evaluation device (16) which evaluates predetermined characteristics of a device under test (DUT, 15) based on the pulse signal having the desired pulse pattern with the predetermined eye closure output from the lowpass filter (14) of the pulse pattern generator (11).

In order to achieve the above object, according to a ninth aspect of the present invention, there is provided a communication device evaluation system utilizing a pulse pattern generator, according to the eighth aspect, wherein the pulse generating unit (12) of the pulse pattern generator (11) includes:

a basic pulse generating unit (12a) which generates a basic pulse signal having a predetermined amplitude value in a predetermined bit string;

a deformation pulse generating unit (12b) which generates a deformation pulse having an amplitude value different from the predetermined amplitude value of the basic pulse signal and having a phase different from the phase of the basic pulse signal, in a bit string identical to the bit string of the basic pulse signal generated by the basic pulse generating unit (12a); and a signal multiplexing unit (12c) which outputs the pulse signal formed in the step-like wave by multiplexing the basic pulse signal generated by the basic pulse generating unit (12a) and the deformation pulse signal generated by the deformation pulse generating unit (12b).

In order to achieve the above object, according to a tenth aspect of the present invention, there is provided a communication device evaluation system utilizing a pulse pattern generator, according to the eighth aspect, wherein the pulse generating unit (12) includes:

a basic pulse generating unit (12a) which generates a basic pulse signal having a predetermined amplitude value in a predetermined bit string;

a plurality of deformation pulse generating units (12b) which generate a plurality of deformation pulse signals having phases equal to or delayed from the phase of the basic pulse signal, in a bit string identical to the bit string of the basic pulse signal generated by the basic pulse generating unit (12a); and a signal multiplexing unit (12c) which outputs the pulse signal formed in the step-like wave by multiplexing the plurality of deformation pulse signals generated by the plurality of deformation pulse generating units (12b).

In order to achieve the above object, according to an eleventh aspect of the present invention, there is provided a communication device evaluation system utilizing a pulse pattern generator, according to the tenth aspect, wherein the plurality of deformation pulse generating units (12b) include:

a first deformation pulse generating unit (12b1) which generates a first deformation pulse signal having a phase equal to or delayed from the phase of the basic pulse signal;

a second deformation pulse generating unit (12b2) which generates a second deformation pulse signal having a phase delayed by a predetermined amount from the phase of the first deformation pulse signal; and a third deformation pulse generating unit (12b3) which generates a third deformation pulse signal having a phase delayed by a predetermined amount from the phase of the second deformation pulse signal.

In order to achieve the above object, according to a twelfth aspect of the present invention, there is provided a communication device evaluation system utilizing a pulse pattern generator, according to the tenth aspect, wherein the plurality of deformation pulse generating units (12b) includes:

a first deformation pulse generating unit (12b1) which generates a first deformation pulse signal having a phase equal to or delayed from the phase of the basic pulse signal;

a second deformation pulse generating unit (12b2) which generates a second deformation pulse signal having a phase delayed by a predetermined amount from the phase of the first deformation pulse signal; and a third deformation pulse generating unit (12b3) which generates a third deformation pulse signal having a phase delayed by a predetermined amount from the phase of the second deformation pulse signal;

a fourth deformation pulse generating unit (12b2) which generates a fourth deformation pulse signal having a phase delayed by a predetermined amount from the phase of the third deformation pulse signal; and a fifth deformation pulse generating unit (12b3) which generates a fifth deformation pulse signal having a phase delayed by a predetermined amount from the phase of the fourth deformation pulse signal.

In order to achieve the above object, according to a thirteenth aspect of the present invention, there is provided a communication device evaluation system utilizing a pulse pattern generator, according to the eighth aspect, wherein the pulse generating unit (30) of the pulse pattern generator (31) includes:

a binary pulse signal generating circuit (31a) which generates a binary pulse signal, the binary pulse signal generating circuit serving as the basic pulse generating circuit (12a);

a one-bit delay circuit (31b) which delays the binary pulse signal output from the binary pulse signal generating circuit (31a) by one bit, and a two-bit delay circuit (31c) which delays the binary pulse signal output from the binary pulse signal generating circuit (31a) by two bits, the one-bit delay circuit and two-bit delay circuit each serving as the deformation pulse generating circuit (12b); and a signal multiplexing unit (31d) which outputs an eight-level pulse signal (33) by multiplexing output signals of the binary pulse signal generating circuit (31a), the one-bit delay circuit (31b), and the two-bit delay circuit (31c).

In order to achieve the above object, according to a fourteenth aspect of the present invention, there is provided a communication device evaluation system utilizing a pulse pattern generator, according to the eighth aspect, wherein the pulse generating unit (12) of the pulse pattern generator (11) includes:

flip-flops (FF1, FF2, . . . ) cascade-connected in a plurality of stages serving as the basic pulse generating circuit (12a) and the deformation pulse generating circuit (12b), a first stage being set as a master while the stages subsequent to the first stage being set as a slave, data having a predetermined data frequency being supplied to a data terminal of the first stage, a clock having a frequency double the data frequency being commonly supplied to a clock terminal of each stage, thereby, when the output from an intermediate stage is set at a reference pulse signal (reference wave), the stage precedent to the intermediate stage outputs the predetermined number of first deformation pulse signals (negative phase deformation waves) having the phases leading the phase of the reference wave by a predetermined phase amount while the stage subsequent to the intermediate stage outputs the predetermined number of second deformation pulse signals (positive phase deformation waves) having the phases delayed from the phase of the reference wave by a predetermined phase amount;

amplifiers (A1, A2, . . . ) having a plurality of stages which receive outputs from each stage of the flip-flops (FF1, FF2, . . . ) cascade-connected in the plurality of stages, respectively; and a signal multiplexing unit (100) which outputs the pulse signal formed in the step-like wave by multiplexing the outputs from each stage of the amplifiers (A1, A1, . . . ) having the plurality of stages, wherein the amplitude-value setting unit (13, 13a) includes a gain setting unit (101, 102, 103) which sets gains at gain setting units (1, 2, . . . ) of the amplifiers (A1, A2, . . . ) having the plurality of stages such that a predetermined amplitude-value relationship is established among the reference pulse signal (reference wave), the first deformation pulse signal (negative phase deformation wave), and the second deformation pulse signal (positive phase deformation wave), in order that finally the output from the lowpass filter (14) has a desired eye closure.

In order to achieve the above object, according to a fifteenth aspect of the present invention, there is provided a communication device evaluation system utilizing a pulse pattern generator, according to the eighth aspect, wherein the device under test (DUT, 15) is a communication device which performs communication with at least one of an electric signal and an optical signal.

According to the above configurations, in the pulse pattern generator of the present invention, the amplitude-value setting unit adjusts the amplitude value having the step-like shape, and the eye-waveform shape is set when the pulse signal is eye-patterninged. Therefore, the pulse signal having the desired pulse pattern with the predetermined eye closure set by the pulse pattern generator can be generated.

Consequently, in the communication device evaluation system utilizing the pulse pattern generator according to the present invention, the pulse signal whose eye is opened or the pulse signal whose eye is not open can be supplied as a test signal from the pulse pattern generator to the device under test. Thus, the evaluation test for the device under test can be simplified to improve the productivity compared with the conventional evaluation system.

Further, in the pulse pattern generator according to the present invention, a signal component in a predetermined frequency range is attenuated in the signal components included in the pulse signal having the desired pulse pattern, smoothed by and output from the lowpass filter.

Accordingly, in the communication device evaluation system utilizing the pulse pattern generator according to the present invention, the device under test can be evaluated with the approximate pulse signal waveform for the pulse signal waveform which is actually transmitted in the telecommunication network, the optical communication network, and the like, so that the reliability of the evaluation result can be improved.

BRIEF DESCRIPTION OF DRAWINGS

FIG. 2 is a block diagram showing a circuit configuration of a pulse generating unit in a pulse pattern generator for use in the communication device evaluation system according to the first embodiment shown in FIG. 1.

FIG. 3A is a view for illustrating a basic pulse and a deformation pulse which are generated by a basic pulse generating circuit and a deformation pulse generating circuit shown in FIG. 2, respectively.

FIG. 3B is a view for illustrating an example in which the basic pulse and the deformation pulse shown in FIG. 3 are multiplexed to generate a four-level pulse signal formed in a step-like wave by means of a signal multiplexer shown in FIG. 2.

FIG. 9 is a block diagram showing a schematic configuration of a third embodiment of a communication device evaluation system according to the present invention.

FIG. 10 is a flowchart illustrating the operation of the communication device evaluation system according to the third embodiment shown in FIG. 9.

FIG. 11 is a block diagram showing a circuit configuration of a pulse generating unit in a pulse pattern generator incorporated in a communication device evaluation system according to a fourth embodiment of the present invention.

FIG. 17 is a block diagram showing a circuit configuration of a pulse generating unit in a pulse pattern generator incorporated in a communication device evaluation system according to an eighth embodiment of the present invention.

BEST MODE FOR CARRYING OUT THE INVENTION

Some embodiments of a pulse pattern generator according to the present invention and a communication device evaluation system utilizing the same will be described below with reference to the drawings.

First Embodiment

First, a configuration of a communication device evaluation system utilizing a pulse pattern generator according to a first embodiment of the present invention will be described below.

Explanation will be given for, as an example, a case where the communication device evaluation system utilizing the pulse pattern generator according to the first embodiment evaluates a device for use in telecommunication such as, for example, a transceiver and a router as a device under test (hereinafter referred to as "DUT").

Figure 1:
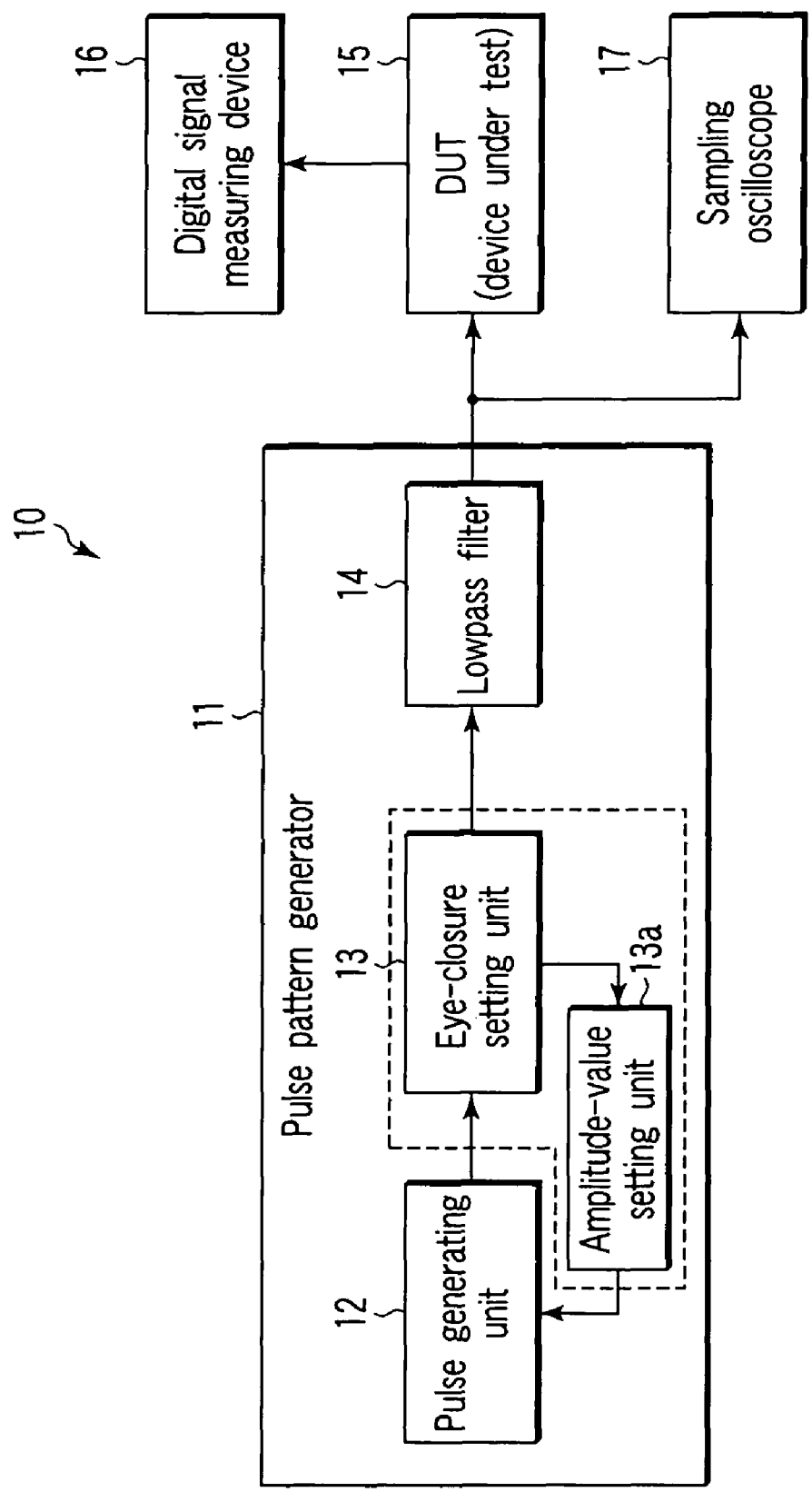
FIG. 1 is a block diagram showing a schematic configuration of a first embodiment of a communication device evaluation system according to the present invention.

As shown in FIG. 1, a communication device evaluation system 10 utilizing the pulse pattern generator of the first embodiment includes: a pulse pattern generator 11 which generates a pulse signal; a digital signal measuring device 16 which measures characteristics of a DUT 15 serving as a communication device for used in telecommunication based on the pulse signal output from the pulse pattern generator 11; and a sampling oscilloscope 17 which monitors the pulse signal output from the pulse pattern generator 11.

The pulse pattern generator 11 includes: a pulse generating unit 12 serving as pulse generating means for generating a pulse signal formed in a step-like wave in which rise and fall of a signal having a predetermined amplitude-value change in a predetermined bit string are changed in a step-like manner; an eye-closure setting unit 13 including an amplitude-value setting unit 13a which sets eye closure (Vertical Eye Closure Penalty: hereinafter referred to as "VECP") based on a level of the pulse signal formed in the step-like wave when the eye pattern of the amplitude value of the pulse signal generated by the pulse generating unit 12 is formed; and a lowpass filter 14 which attenuates a signal components not lower than a predetermined frequency among signal components included in the pulse signal generated by the pulse generating unit 12, and smoothes the pulse signal formed in the step-like wave to output a smoothed pulse signal. The pulse pattern generator 11 is characterized in that a pulse signal having a desired pulse pattern with the predetermined eye closure set by the amplitude-value setting unit 13a can be output from the lowpass filter 14.

As shown in FIG. 2, in order to generate the pulse signal formed in the step-like wave in which at least one of the rise and fall of the signal having a predetermined amplitude-value change in a predetermined bit string is changed in a step-like manner, the pulse generating unit 12 includes: a basic pulse generating circuit 12a which generates a basic pulse signal; a deformation pulse generating circuit 12b which generates a deformation pulse signal 22 obtained by deforming a basic pulse signal 21 generated by the basic pulse generating circuit 12a in a pulse signal having a predetermined pulse waveform; and a signal multiplexer 12c which outputs a pulse signal 23 including the step-like wave by multiplexing the basic pulse signal 21 generated by the basic pulse generating circuit 12a and the deformation pulse signal 22 generated by the deformation pulse generating circuit 12b.

Specifically, as shown in the upper side of FIG. 3A, the basic pulse generating circuit 12a is configured to generate a binary basic pulse signal 21 having predetermined amplitude values in a predetermined bit string, e.g., predetermined amplitude values including a first level "a" and a second level "b".

As shown in FIG. 3A, the deformation pulse generating circuit 12b is configured to generate the deformation pulse signal 22 whose amplitude is contracted to a predetermined value while delaying a time (phase) by only one bit with respect to the phase of the basic pulse signal 21, in order that the deformation pulse generating circuit 12b generates a deformation pulse which has a phase different from the phase of the basic pulse signal 21 while having an amplitude value smaller than the predetermined amplitude value of the basic pulse signal 21 in a bit string identical to the bit string of the basic pulse signal 21 generated by the basic pulse generating unit 12a.

The deformation pulse signal 22 is a binary signal having a predetermined amplitude including a first level "c" and a second level "d" (however, the amplitude is smaller than the amplitude of the basic pulse signal 21).

As shown in FIG. 3B, the signal multiplexer 12c is configured to generate a four-level pulse signal 23 by multiplexing the basic pulse signal 21 and the deformation pulse signal 22.

The four-level pulse signal 23 has a first level "a", a second level "e", a third level "f", and a fourth level "b". The four-level pulse signal 23 is formed in a step-like wave in which a signal waveform is changed in a step-like manner, e.g., in a rise period t1 to t2 or a fall period t3 to t4.

Figure 4A:
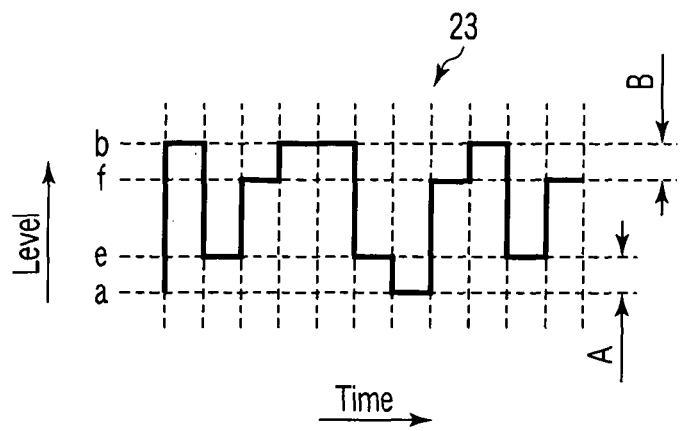
FIG. 4A is a view showing the four-level pulse signal generated by the signal multiplexer shown in FIG. 2.

As shown in FIG. 4A, the eye-closure setting unit 13 sets a level A which is a difference between the first level "a" and the second level "e" of the four-level pulse signal 23 and a level B which is a difference between the third level "f" and the fourth level "b" of the four-level pulse signal 23, to the pulse generating unit 12 through the amplitude-value setting unit 13a based on the VECP standard established in the stress test.

Now, VECP will be described.

Figure 4B:
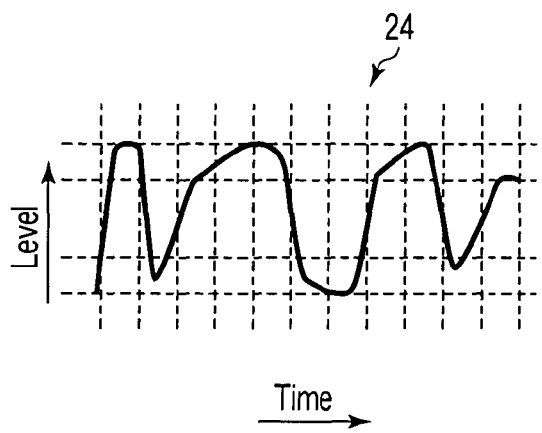
FIG. 4B is a view showing the pulse signal after the pulse signal passes through a lowpass filter shown in FIG. 2.
Figure 4C:
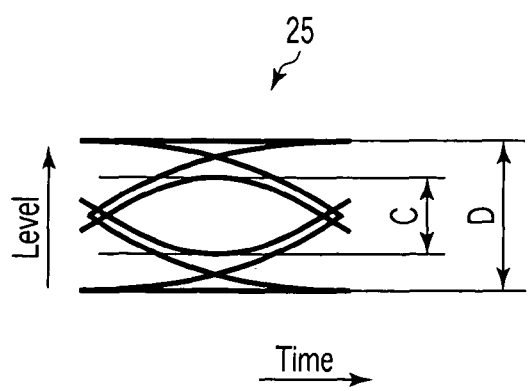
FIG. 4C is a view showing an example of an eye waveform of the pulse signal after the pulse signal passes through the lowpass filter shown in FIG. 2.

An eye waveform 25 shown in FIG. 4C is one in which the eye pattern of the pulse signals observed by the sampling oscilloscope 17, i.e., the eye pattern of the amplitude values of the pulse signals input to the DUT 15 is formed.

VECP is determined by the following expression using levels C and D in the eye waveform 25.

In this case, the level C represents an eye closure level, and the level D represents a level in which inter-code interference is removed.

$$VECP(dB) = 10 \times \text{Log}(D/C) \quad (1)$$

For example, when the DUT 15 is evaluated by setting VECP at 2.6 dB, the levels A and B are set to the pulse generating unit 12 from the eye-closure setting unit 13 through the amplitude-value setting unit 13a such that the level C becomes about 55% with respect to the level D.

At this point, the eye-closure setting unit 13 can set the levels A and B at desired values by changing a ratio of the amplitude of the basic pulse signal 21 shown in FIG. 3 and the amplitude of the deformation pulse signal 22 shown in FIG. 3.

The eye-closure setting unit 13 may be configured to set one of the levels A and B such that a desired VECP is obtained.

The lowpass filter 14 is configured to output an approximate waveform for a pulse-signal waveform transmitted in the actual communication network by attenuating the signals not lower than a predetermined cut-off frequency when the lowpass filter 14 smoothes the pulse signal formed in the step-like wave to output the smoothed pulse signal.

Specifically, when the pulse signal 23 shown in FIG. 4A is input to the lowpass filter 14, the lowpass filter 14 outputs, for example, a pulse signal 24 shown in FIG. 4B.

The digital signal measuring device 16 includes a microprocessor, a ROM, a RAM, a display, a keyboard, and the like. When the DUT 15 receives the pulse signal whose levels are set by the VECP standard, the digital signal measuring device 16 can obtain the characteristics of the DUT 15 such as an error rate and a wavelength of the pulse signal, data such as the pulse-signal level and distribution data, and can also observe the waveform of the pulse signal.

The digital signal measuring device 16 is also configured to obtain error distribution data, waveform data of an error generation point, and the like when the DUT 15 generates the error.

The sampling oscilloscope 17 includes a vertical amplifier, a horizontal amplifier, a trigger-pulse generator, an analog/digital (A/D) converter, a cathode ray tube (CRT), and the like. The sampling oscilloscope 17 displays the waveform of the input electric signal on the CRT.

The operation of the communication device evaluation system 10 utilizing the pulse pattern generator according to the first embodiment will next be described with reference to FIGS. 1 to 5.

Figure 5:
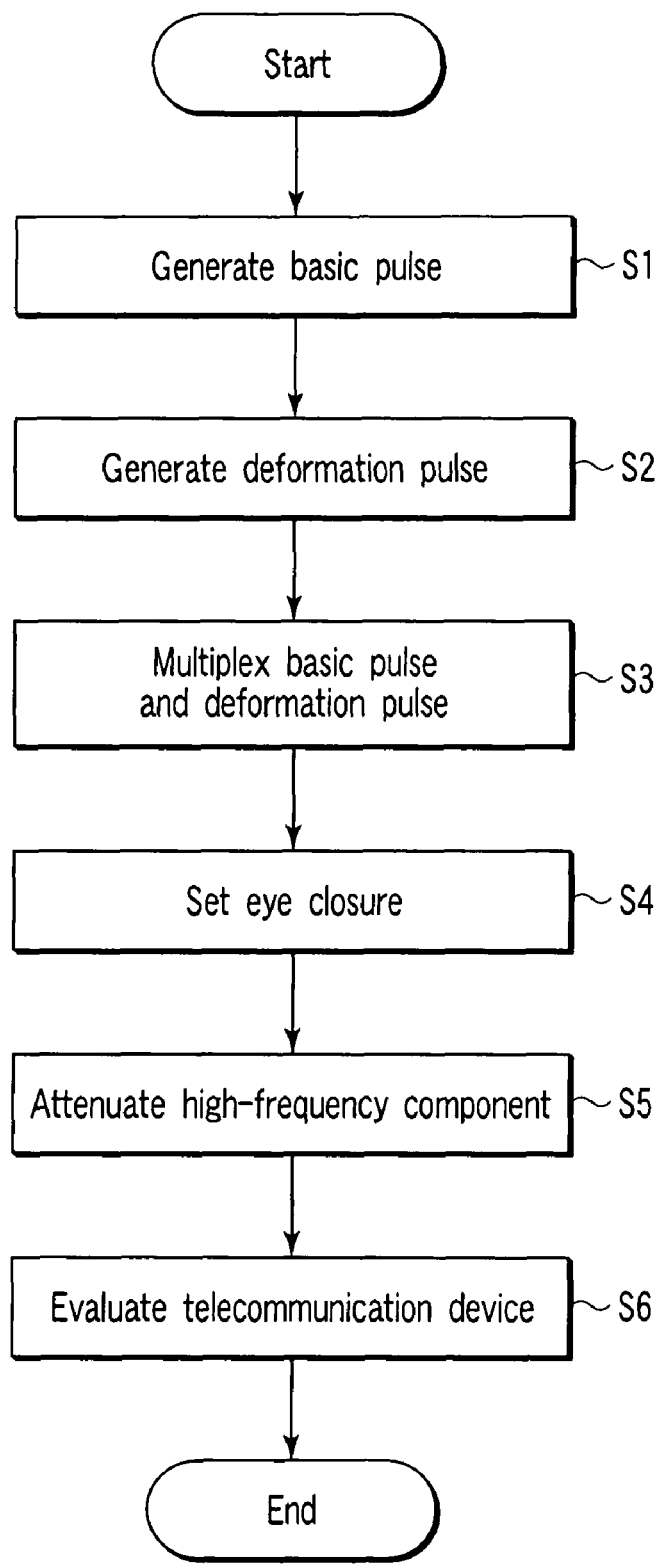
FIG. 5 is a flowchart illustrating an operation of the communication device evaluation system according to the first embodiment shown in FIG. 1.

In FIG. 5, the basic pulse generating circuit 12a first generates the binary basic pulse signal 21 as shown in the upper side of FIG. 3A (step S1).

Next, the deformation pulse generating circuit 12b generates the deformation pulse signal 22 shown in the lower side of FIG. 3A (step S2). In the deformation pulse signal 22, the time (phase) is delayed by one bit to a time axis of the basic pulse signal 21, and the amplitude is contracted to the predetermined value.

Then, the signal multiplexer 12c multiplexes the basic pulse signal 21 and the deformation pulse signal 22 to generate the four-level pulse signal 23 in which the amplitude value is formed in a step-like manner in the rise period and the fall period (step S3).

Subsequently, the eye-closure setting unit 13 sets the levels A and B of the four-level pulse signal 23 shown in FIG. 4A based on VECP, which allows the eye closure to be set (step S4).

At this point, the setting of the eye closure is performed while the eye waveform 25 displayed on the sampling oscilloscope 17 is monitored.

Specifically, the measurement values of the levels C and D of the eye waveform 25 are obtained by monitoring the eye waveform 25 displayed on the sampling oscilloscope 17, and the levels A and B of the four-level pulse signal 23 are changed by the eye-closure setting unit 13 such that the measurement values of the levels C and D are substituted in formula (1) to obtain the desired VECP.

Then, the lowpass filter 14 smoothes the four-level pulse signal 23 by attenuating the high-frequency components not lower than the cut-off frequency among the signal components included in the four-level pulse signal 23, which allows the four-level pulse signal 23 to be changed to the desired pulse waveform and output (step S5).

The digital signal measuring device 16 performs the evaluation of the telecommunication device which is the DUT 15 (step S6).

Specifically, the digital signal measuring device 16 obtains various items of data such as the error rate of the DUT 15, the wavelength of the pulse signal, and the pulse-signal level, the error distribution data, the waveform data of the error generation point, and the like.

Thus, according to the configuration of the communication device evaluation system 10 utilizing the pulse pattern generator of the embodiment, the pulse generating unit 12 generates the pulse signal formed in the step-like wave in which the rise and fall of the signal are changed in the step-like manner, and the eye-closure setting unit 13 sets the amplitude value of the pulse signal based on the level of the step-like wave when the eye pattern of the VECP is formed. Therefore, the stress test of the device under test for use in telecommunication can be simplified to increase the productivity when compared with the conventional evaluation system.

In the embodiment, the pulse signal 23 formed in the step-like wave in which the rise and fall of the signal are changed in the step-like manner is described as an example, but, the invention is not limited to the pulse signal 23.

For example, the same effect can be obtained also when the pulse signal formed in the step-like wave in which at least one of the rise and fall of the signal is changed in the step-like manner is used.

In the embodiment, the basic pulse signal 21 and deformation pulse signal 22 generated by the pulse generating unit 12 are multiplexed, and the eye-closure setting unit 13 adjusts the amplitude of the step-like wave of the four-level pulse signal 23 obtained by the multiplexing through the amplitude-value setting unit 13a. However, the invention is not limited thereto.

For example, the same effect is obtained also when the deformation pulse signal 22 and the basic pulse signal 21 are multiplexed to obtain the four-level pulse signal 23 after the eye-closure setting unit 13 previously sets the amplitude value of the deformation pulse signal 22.

The eye-closure setting unit 13 may be configured to adjust the amplitude values other than the amplitude value of the step-like wave, for example, the levels "a" and "b" of the four-level pulse signal 23.

In the embodiment, the stress test is performed with the four-level pulse signal 23, but the invention is not limited thereto.

For example, the same effect is obtained also when the stress test is performed with a six-level pulse signal or an eight-level pulse signal.

Figure 6:
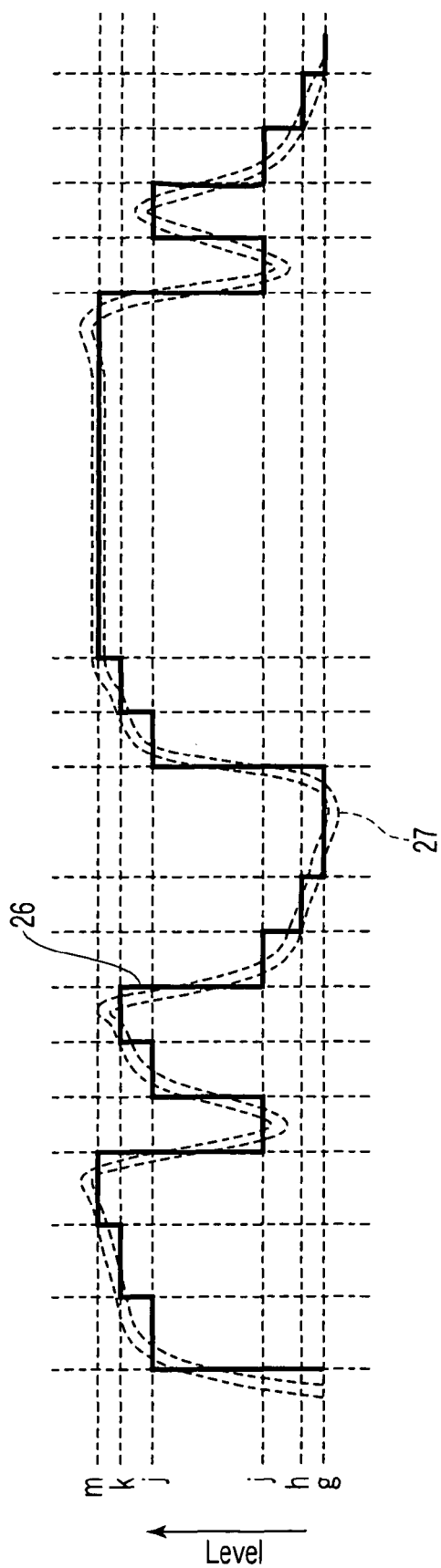
FIG. 6 is a view illustrating a modification in which a six-level pulse signal formed in a step-like wave is generated by the pulse generating unit shown in FIG. 2.

For example, when the stress test is performed with a six-level pulse signal 26 shown in FIG. 6, the desired eye closure may be set by changing the values of levels "h" and "i" to the value of a level "g" and by changing the values of levels "j" and "k" to the value of a level "m" by means of the eye-closure setting unit 13.

Note that the pulse signal 26 becomes, for example, a pulse signal 27 shown by a broken line in FIG. 6 when the pulse signal 26 passes through the lowpass filter 14.

In the embodiment, the case where the device for use in telecommunication is tested as the device under test is described as an example, but the invention is not limited thereto.

For example, the same effect is obtained as long as a device capable of performing the evaluation by using a pulse signal having a step-like wave can be tested as the device under test.

Second Embodiment

First, a configuration of a communication device evaluation system utilizing a pulse pattern generator according to a second embodiment of the invention will be described with reference to FIG. 7.

In this embodiment, explanation will be given for, as an example, a case where the communication device evaluation system utilizing the pulse pattern generator evaluates DUT such as an equalizer for converting a pulse signal whose eye closure is extremely low or a pulse signal whose eye is not opened into a pulse signal whose eye is opened.

However, the communication device evaluation system utilizing the pulse pattern generator of the second embodiment is one in which a modification is made to the pulse pattern generator 11 shown in FIG. 1 in the communication device evaluation system 10 utilizing the pulse pattern generator of the first embodiment of the invention, and other configurations thereof are similar to those of the communication device evaluation system 10.

Figure 7:
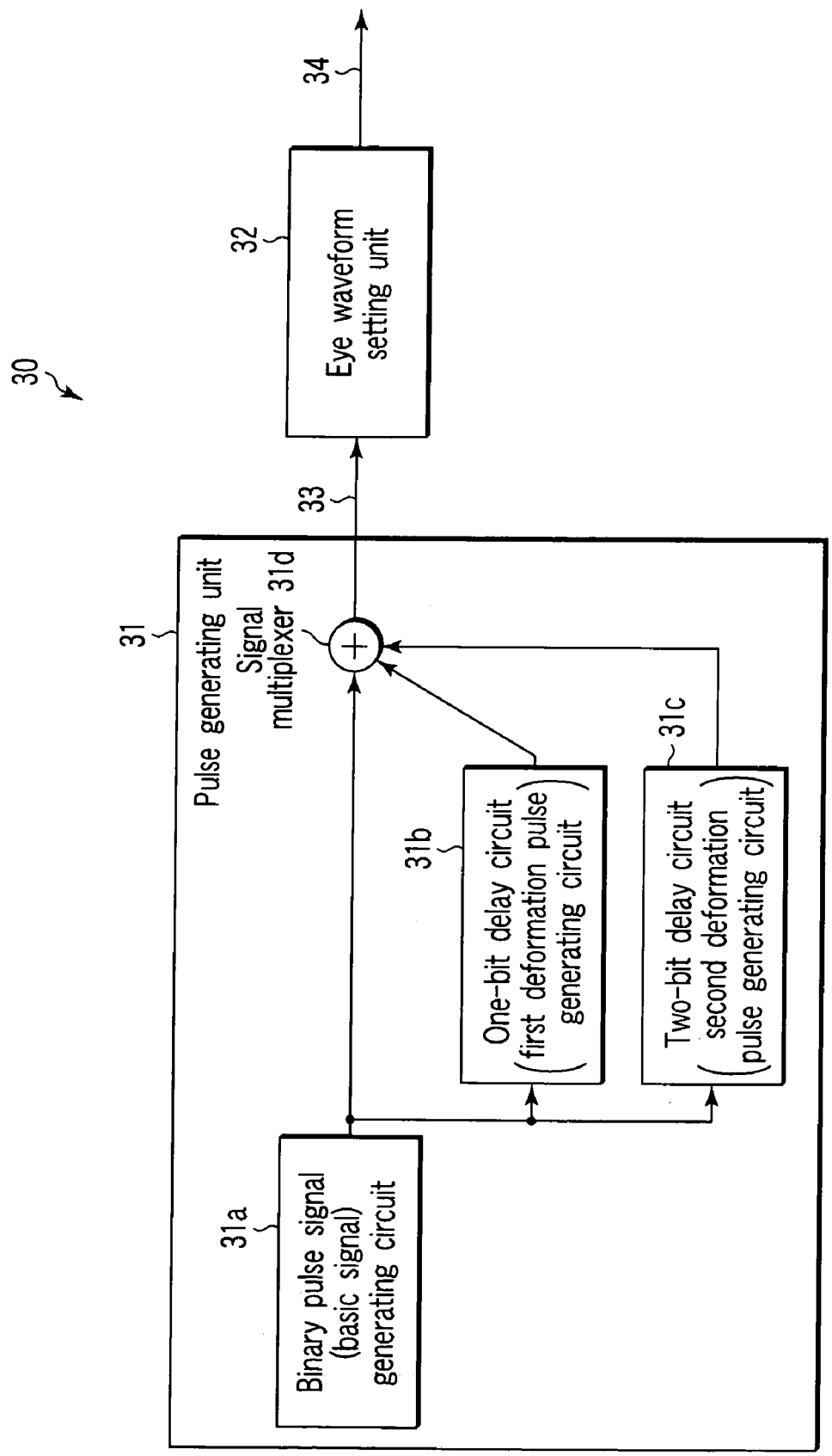
FIG. 7 is a block diagram showing a circuit configuration of a pulse generating unit in a pulse pattern generator incorporated in a communication device evaluation system according to a second embodiment of the invention.

Therefore, in FIG. 7, the illustration will be omitted for the same configuration as in FIG. 1.

As shown in FIG. 7, a pulse pattern generator 30 in the communication device evaluation system utilizing the pulse pattern generator according to the second embodiment includes: a pulse generating unit 31 serving as pulse generating means for generating a pulse signal formed in a step-like wave in which the rise and fall of the signal are changed in a step-like manner; and an eye waveform setting unit 32 serving as amplitude-value setting means for setting a shape of an eye waveform when an eye pattern an amplitude value of the pulse signal is formed.

The shape of the eye waveform includes a waveform shape in a state in which the eye is opened and a waveform shape in a state in which the eye is not opened.

The pulse generating unit 31 includes: a binary pulse signal generating circuit 31a which generates a binary pulse signal, the circuit 31a serving as the basic pulse generating circuit 12a; a one-bit delay circuit 31b which delays the binary pulse signal output from the binary pulse signal generating circuit 31a by one bit, and a two-bit delay circuit 31c which delays the binary pulse signal output from the binary pulse signal generating circuit 31a by two bits, the circuits 31b and 31c serving as the deformation pulse generating circuit 12b; and a signal multiplexer 31d which outputs an eight-level pulse signal 33 by multiplexing the output signals of the binary pulse signal generating circuit 31a, the one-bit delay circuit 31b, and the two-bit delay circuit 31c.

Figure 8A:
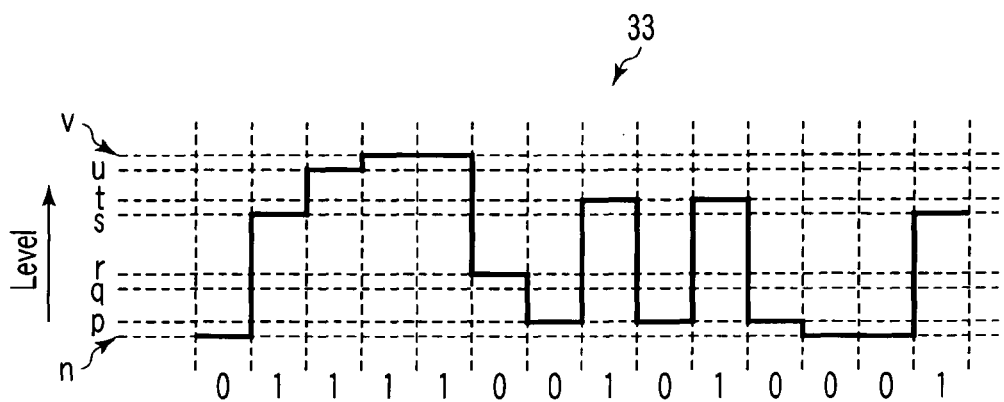
FIG. 8A is a view illustrating an example in which an eight-level pulse signal formed in a step-like wave is generated by the pulse generating unit shown in FIG. 7.

Specifically, for example, the pulse generating unit 31 is configured to generate an eight-level pulse signal 33 having amplitude values ranging from a level "n", to levels "p", "q", "r", "s", "t", "u", and "v" as shown in FIG. 8A.

The eight-level pulse signal 33 shown in FIG. 8 expresses "01111001010001".

Figure 8B:
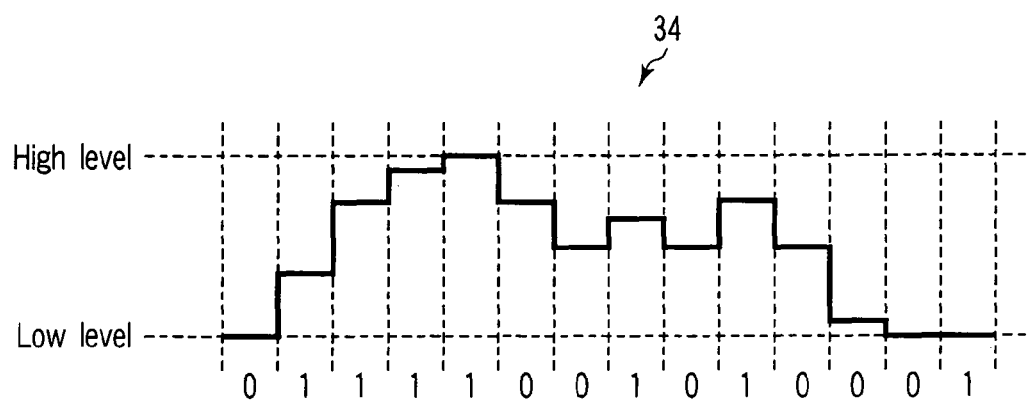
FIG. 8B is a view showing an example of a pulse signal whose eye set by an eye waveform setting unit of the pulse generating unit shown in FIG. 7 is not opened.

The eye waveform setting unit 32 is configured to set the levels of the step-like wave of the pulse signal 33 at predetermined values to output, for example, an eight-level pulse signal 34 shown in FIG. 8B.

Figure 8C:
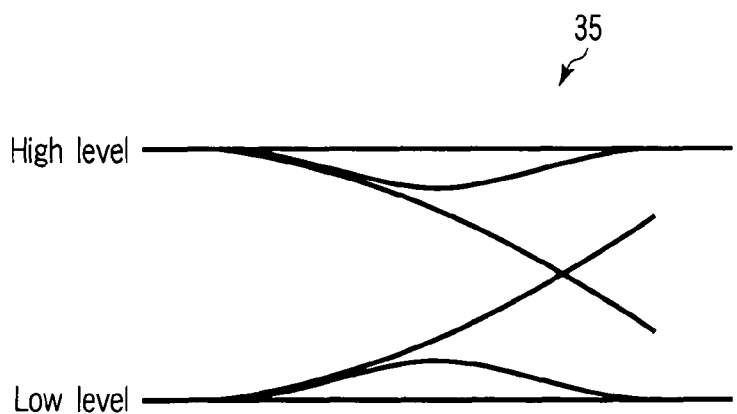
FIG. 8C is a view showing an example in which the pulse signal whose eye set by the eye waveform setting unit of the pulse generating unit shown in FIG. 8 is not opened is observed as an eye waveform whose eye is not opened after the pulse signal passes through the lowpass filter.

When the eight-level pulse signal 34 is monitored by the sampling oscilloscope 17 (see FIG. 1), a waveform 35 in which the eye is not opened is observed as shown in FIG. 8C.

In this case, the eye waveform setting unit 32 can convert the input pulse signal into a pulse signal whose eye is not opened.

Next, an operation of the communication device evaluation system utilizing the pulse pattern generator according to the second embodiment will be described.

However, the detailed description of the same operation as that of the communication device evaluation system 10 utilizing the pulse pattern generator of the first embodiment of the invention will be omitted.

First, the binary pulse signal is generated by the binary pulse signal generating circuit 31a serving as the basic pulse generating circuit.

Then, the one-bit delay circuit 31b and the two-bit delay circuit 31c which are serve as the deformation pulse generating circuit respectively generate the one-bit delayed pulse signal and the two-bit delayed pulse signal from the binary pulse signal generated by the binary pulse signal generating circuit 31a.

Next, the signal multiplexer 31d generates the eight-bit pulse signal 33 by multiplexing the binary pulse signal generated by the binary pulse signal generating circuit 31a, the pulse signal delayed by the one bit by means of the one-bit delay circuit 31b, and the pulse signal delayed by two bits by means of the two-bit delay circuit 31c.

Subsequently, the eye waveform setting unit 32 sets the levels of the step-like wave of the pulse signal 33 at the predetermined values to output the pulse signal 34 obtaining the waveform 35 in which the eye is not opened.

The pulse signal 34 is input to the DUT 15 through the lowpass filter 14, and the characteristics of the DUT 15 are evaluated by the digital signal measuring device 16.

As a result, it is tested whether or not the DUT 15 can output the pulse signal having how degree of the eye closure to the pulse signal 34 of the waveform 35 in which the eye is not opened.

Thus, according to the configuration of the communication device evaluation system utilizing the pulse pattern generator of the second embodiment, the pulse generating unit 31 generates the pulse signal formed in the step-like wave in which the rise and fall of the signal are changed in the step-like manner, and the eye waveform setting unit 32 sets the step-like wave levels to output the pulse signal 34 obtaining the waveform 35 in which the eye is not opened. Therefore, the test for evaluating the device under test which converts the pulse signal whose eye is not opened into the pulse signal whose eye is opened can be simplified, so that the productivity can be increased compared with the conventional evaluation system when the stress test is performed in the production line.

The embodiment describes, as an example, the case where the eye waveform setting unit 32 sets the pulse signal whose eye is not opened at the eight-level pulse signal. However, the invention is not limited thereto.

For example, the same effect is obtained as long as the eye waveform setting unit 32 sets the pulse signal whose eye closure is extremely low or the pulse signal whose eye is not opened at the pulse signal formed in the step-like wave in which the rise and fall of the signal are changed in the step-like manner.

Third Embodiment

First, a configuration of a communication device evaluation system utilizing a pulse pattern generator according to a third embodiment of the invention will be described with reference to FIG. 9.

In the communication device evaluation system utilizing the pulse pattern generator according to the third embodiment, explanation will be given for a case where a device for use in optical communication, such as an optical transceiver and an optical transponder is evaluated as the DUT.

However, in FIG. 9, the same configuration as the communication device evaluation system 10 utilizing the pulse pattern generator according to the first embodiment of the invention is designated by the same numeral, and the detailed description will be omitted.

As shown in FIG. 9, a communication device evaluation system 40 utilizing the pulse pattern generator according to the third embodiment includes: the pulse pattern generator 11; an electric/optical converter (hereinafter referred to as "E/O converter") 41 which converts the pulse signal output from the pulse pattern generator 11 into an optical signal; an optical attenuator (hereinafter referred to as "optical ATT") 42 which adjusts an optical-signal level to a predetermined value; the digital signal measuring device 16 which measures the characteristics of the DUT 15 which is of the device for use in optical communication; and a sampling oscilloscope 44 which monitors the optical signal output from the optical ATT 42 by converting the optical signal into an electric signal.

The E/O converter 41 is composed of an optical transmission unit provided with a laser diode, an interface unit, and the like. The E/O converter 41 is configured to convert an electric pulse signal output from the pulse pattern generator 11 into an optical pulse signal, and output the optical pulse signal to an optical fiber 45a.

The optical ATT 42 is configured to adjust the level of the optical signal output from the optical fiber 45a to a predetermined value and output the optical signal to an optical fiber 45b.

The digital signal measuring device 16 includes a microprocessor, a read-only memory (ROM), a random access memory (RAM), a display, and a keyboard. When a DUT 43 receives an optical signal whose level is set by the VECP standard, the digital signal measuring device 16 can obtain the characteristics of the DUT 43, for example, various items of data such as the error rate, the wavelength of the optical signal, and the optical-signal level, and the distribution data, and can observe the waveform.

The digital signal measuring device 16 is configured to obtain the error distribution data, the waveform data of the error generation point, and the like, when the DUT 43 generates the error.

The sampling oscilloscope 44 includes a vertical amplifier, a horizontal amplifier, a trigger-pulse generator, an E/O converter, and a CRT. The sampling oscilloscope 44 is configured to display the waveform of the input electric signal on the CRT by converting the input electric signal into an electric signal.

Next, an operation of the communication device evaluation system 40 utilizing the pulse pattern generator of the third embodiment will be described with reference to FIGS. 9 and 10.

However, the detailed description of the same operation as that of the communication device evaluation system 10 utilizing the pulse pattern generator of the first embodiment of the invention will be omitted.

In step S5 of FIG. 10, the lowpass filter 14 attenuates and smoothes the high-frequency component of the signal pulse formed in the step-like wave, and the E/O converter 41 converts the attenuated and smoothed pulse signal into the optical signal (step S7).

The optical ATT 42 sets the level of the optical signal at the predetermined value (step S8), and the optical signal is output to the DUT 43.

Then, the digital signal measuring device 16 performs the evaluation of the optical communication device which is the DUT 43 (step S9).

Specifically, the digital signal measuring device 16 obtains various items of data such as the error rate of the DUT 43, the wavelength of the optical signal, and the optical-signal level, the error distribution data, and the waveform data of the error generation point.

Thus, according to the configuration of the communication device evaluation system 40 utilizing the pulse pattern generator of the third embodiment, the pulse generating unit 12 generates the pulse signal formed in the step-like wave in which the rise and fall of the signal are changed in the step-like manner, and the eye-closure setting unit 13 sets the amplitude value of the pulse signal based on the level of the step-like wave when the eye pattern of VECP is formed. Therefore, the stress test of the DUT 43 for use in optical communication can be simplified to increase the productivity when compared with the conventional evaluation system.

Fourth Embodiment

A configuration of a communication device evaluation system utilizing a pulse pattern generator according to a fourth embodiment of the invention will be described with reference to FIG. 11.

The communication device evaluation system utilizing the pulse pattern generator according to the fourth embodiment is one in which a modification is made to the pulse generating unit 12 shown in FIG. 1 of the pulse pattern generator 11 in the communication device evaluation system 10 utilizing the pulse pattern generator according to the first embodiment of the invention. Other configurations thereof are similar to those of the communication device evaluation system 10 shown in FIG. 1.

Therefore, in FIG. 11, only the pulse generating unit 12 is illustrated, and the illustration will be omitted for the same configuration as in FIG. 1.

As shown in FIG. 11, in the communication device evaluation system utilizing the pulse pattern generator according to the fourth embodiment, in order to generate the pulse signal formed in the step-like wave in which the rise and fall of the signal are changed in the step-like manner, the pulse generating unit 12 of the pulse pattern generator 11 includes: a basic pulse generating circuit 12a which generates a basic pulse signal having a predetermined amplitude in a predetermined bit string; a first deformation pulse generating circuit 12b1 which generates a first deformation pulse signal having a phase equal to or delayed from the basic pulse signal in the same bit string as the bit string of the basic pulse signal generated by the basic pulse generating circuit 12a; a second deformation pulse generating circuit 12b2 which generates a second deformation pulse signal having a phase delayed by a predetermined amount from the phase of the first deformation pulse signal in the same bit string as the bit string of the basic pulse signal generated by the basic pulse generating circuit 12*a*; a third deformation pulse generating circuit 12*b*3 which generates a third deformation pulse signal having a phase delayed by a predetermined amount from the phase of the first deformation pulse signal in the same bit string as the bit string of the basic pulse signal generated by the basic pulse generating circuit 12*a*; and the signal multiplexer 12*c* which outputs the pulse signal formed in the step-like wave by multiplexing the first, second, and third deformation pulse signals which are generated by the first, second, and third deformation pulse generating circuits 12*b*1, 12*b*2, and 12*b*3, respectively.

The first deformation pulse generating circuit 12*b*1 includes: a first delay unit 12*b*11 which receives the basic pulse signal 21 to delay the phase of the basic pulse signal 21; and a first amplitude adjusting unit 12*b*12 which adjusts the amplitude of the pulse signal output from the first delay unit 12*b*11.

Similarly, the second deformation pulse generating circuit 12*b*2 includes: a second delay unit 12*b*21 which receives the basic pulse signal 21 to delay the phase of the basic pulse signal 21; and a second amplitude adjusting unit 12*b*22 which adjusts the amplitude of the pulse signal output from the second delay unit 12*b*21.

Similarly, the third deformation pulse generating circuit 12*b*3 includes: a third delay unit 12*b*31 which receives the basic pulse signal 21 to delay the phase of the basic pulse signal 21; and a third amplitude adjusting unit 12*b*32 which adjusts the amplitude of the pulse signal output from the third delay unit 12*b*31.

At this point, the delay amounts of the first delay unit 12*b*11, the second delay unit 12*b*21, and the third delay unit 12*b*31 are set such that a relationship of (delay amount of first delay unit 12*b*11)<(delay amount of second delay unit 12*b*21) <(delay amount of third delay unit 12*b*31) is established.

The delay amount of the first delay unit 12*b*11 may be set at zero, or the first delay unit 12*b*11 may be configured to be omitted.

The second deformation pulse generating circuit 12*b*2 is a reference pulse generating circuit which generates a reference pulse signal 22*b* that becomes a reference of the step-like wave which is formed by the multiplexing in the signal multiplexer 12*c*.

Accordingly, the second amplitude adjusting unit 12*b*22 of the second deformation pulse generating circuit 12*b*2 may be configured to be omitted.

Specifically, the basic pulse generating circuit 12*a* generates the basic pulse signal (basic wave) 21 having the predetermined amplitude in the predetermined bit string.

The first deformation pulse generating circuit 12*b*1 generates a first deformation pulse signal (the phase of the reference pulse −180°) 22*a* which has a phase equal to or delayed from the basic pulse signal, and which has an amplitude of a quarter of the predetermined amplitude.

The second deformation pulse generating circuit 12*b*2 generates a second deformation pulse signal 22*b* which has a phase delayed by a predetermined amount of 180° from the phase of the first deformation pulse signal, and which has the same amplitude as the predetermined amplitude.

That is, the second deformation pulse signal 22*b* is the reference pulse signal 22*b*.

Figure 12:
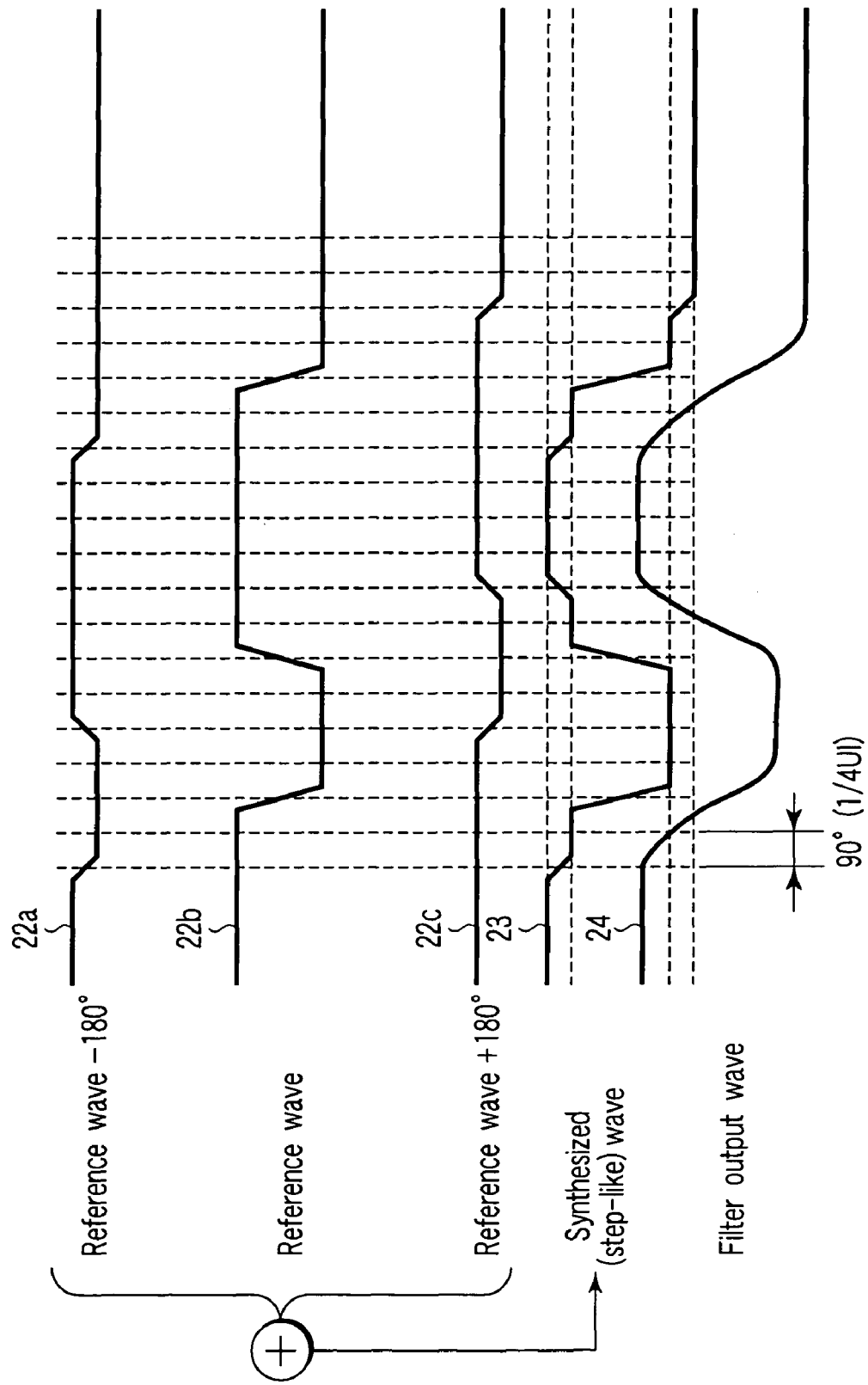
FIG. 12 is a view showing a four-level pulse signal formed in a step-like wave by a pulse generating unit shown in FIG. 11 and an output wave after the four-level pulse signal passes through the lowpass filter.

The third deformation pulse generating circuit 12*b*3 generates a third deformation pulse signal (the phase of the reference pulse +180°) 22*c* which has a phase delayed by a predetermined amount of 180° from the phase of the second deformation pulse signal shown in FIG. 12, and which has an amplitude of a quarter of the predetermined amplitude.

The signal multiplexer 12*c* outputs the pulse signal (synthesized wave) 23 formed in the step-like wave shown in FIG. 12 by multiplexing the first deformation pulse 22*a*, the second deformation pulse 22*b*, and the third deformation pulse signal 22*c*.

The pulse signal (synthesized wave) 23 formed in the step-like wave is smoothed by passing through the lowpass filter of FIG. 1, and the smoothed pulse signal is transmitted in the form of a filter output wave 24 shown in FIG. 12 to the DUT 15 and the sampling oscilloscope 17 of FIG. 1 for the purpose of the stress test of the device under test.

In this case, in order that the filter output wave 24 finally has the desired eye closure, the eye-closure setting unit 13 of FIG. 1 shall adjust the basic pulse generating circuit 12*a* and the first and second deformation pulse generating circuit 12*b*1 and 12*b*2 of the pulse generating unit 12 through the amplitude-value setting unit 13*a* such that the first deformation pulse signal (the phase of the reference pulse −180°) 22*a*, the second deformation pulse signal (reference pulse) 22*b*, and the third deformation pulse signal (the phase of the reference pulse +180°) 22*c* have a predetermined amplitude-value relationship and a phase relationship.

When the pulse generating unit is connected to an unknown E/O converter or the like, similarly to the third embodiment, sometimes VECP is adjusted by using feedback information from the sampling oscilloscope.

Fifth Embodiment

First, a configuration of a communication device evaluation system utilizing a pulse pattern generator according to a fifth embodiment of the invention will be described with reference to FIG. 13.

The communication device evaluation system utilizing the pulse pattern generator according to the fifth embodiment is one in which a modification is made to the pulse generating unit 12 shown in FIG. 11 of the pulse pattern generator 11 according to the fourth embodiment of the invention, so that the difference from the fourth embodiment will be described below.

Figure 13:
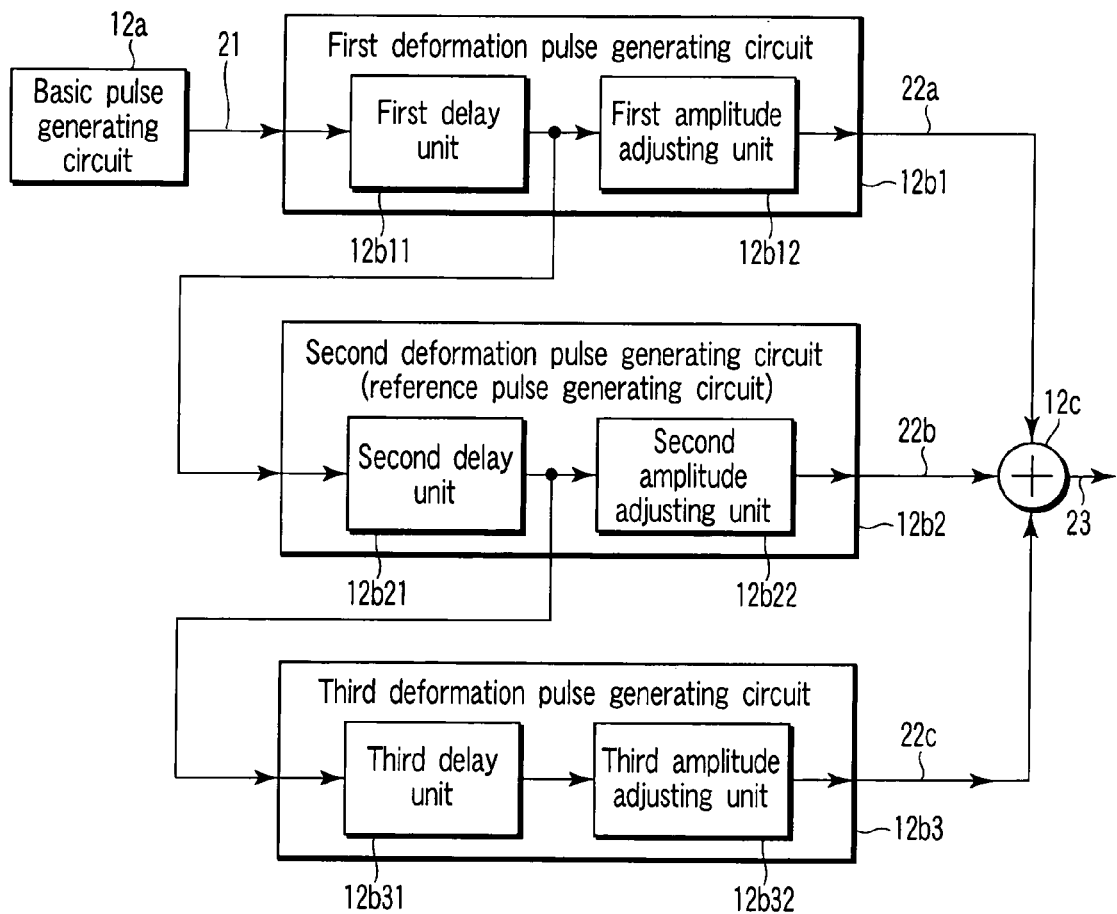
FIG. 13 is a block diagram showing a circuit configuration of a pulse generating unit in a pulse pattern generator incorporated in a communication device evaluation system according to a fifth embodiment of the present invention.

As shown in FIG. 13, the basic pulse generating circuit 12*a* generates the basic pulse signal (basic wave) 21 having the predetermined amplitude in the predetermined bit string.

The first deformation pulse generating circuit 12*b*1 generates a first deformation pulse signal (the phase of the reference pulse −180°) 22*a* which has a phase equal to or delayed from the basic pulse signal, and which has an amplitude of a quarter of the predetermined amplitude.

The second deformation pulse generating circuit 12*b*2 receives an output from the first delay unit 12*b*11 of the first deformation pulse generating circuit 12*b*1, and generates a second deformation pulse signal 22*b* shown in FIG. 12, the second deformation pulse signal 22*b* having a phase delayed by a predetermined amount of 180° from the phase of the first deformation pulse signal, and having the same amplitude as the predetermined amplitude.

That is, the second deformation pulse signal 22*b* is a reference pulse.

The third deformation pulse generating circuit 12*b*3 receives an output from the second delay unit 12*b*21 of the second deformation pulse generating circuit 12*b*2, and generates a third deformation pulse signal (the phase of the reference pulse +180°) 22*c* shown in FIG. 12, the third deformation pulse signal 22*c* having a phase delayed by a predetermined amount of 180° from the phase of the second deformation pulse signal, and having an amplitude of a quarter of the predetermined amplitude.

The signal multiplexer 12c outputs the pulse signal (synthesized wave) 23 formed in the step-like wave shown in FIG. 12 by multiplexing the first deformation pulse 22a, the second deformation pulse 22b, and the third deformation pulse signal 22c.

In the fourth embodiment, the delay amounts of the first delay unit 12b11, the second delay unit 12b21, and the third delay unit 12b31 are set such that the relationship of (delay amount of first delay unit 12b11)<(delay amount of second delay unit 12b21)<(delay amount of third delay unit 12b31) is established. However, in the fifth embodiment, it is not always necessary to satisfy the above relationship.

Other descriptions will be omitted because other configurations are similar to those of the fourth embodiment.

Sixth Embodiment

First, a configuration of a communication device evaluation system utilizing a pulse pattern generator according to a sixth embodiment of the invention will be described with reference to FIG. 14.

The communication device evaluation system utilizing the pulse pattern generator according to the sixth embodiment is one in which a modification is made to the pulse generating unit 12 shown in FIG. 1 of the pulse pattern generator 11 in the communication device evaluation system 10 utilizing the pulse pattern generator according to the first embodiment of the invention. Other configurations thereof are similar to those of the communication device evaluation system 10 shown in FIG. 1.

Figure 14:
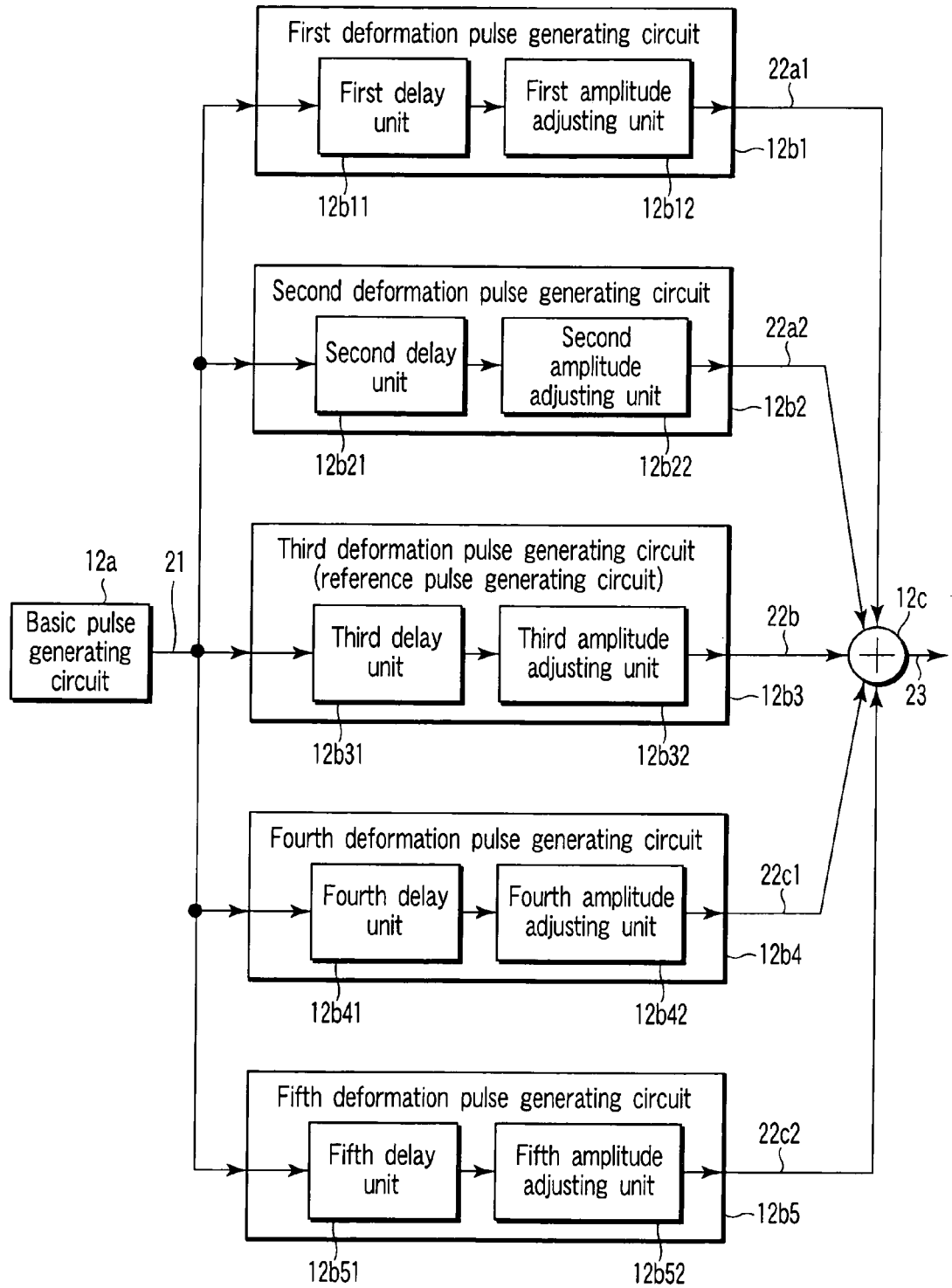
FIG. 14 is a block diagram showing a circuit configuration of a pulse generating unit in a pulse pattern generator incorporated in a communication device evaluation system according to a sixth embodiment of the present invention.

Therefore, in FIG. 14, only the pulse generating unit 12 is illustrated, and the illustration will be omitted for the same configuration as in FIG. 1.

As shown in FIG. 14, in the communication device evaluation system utilizing the pulse pattern generator according to the sixth embodiment, in order to generate the pulse signal formed in the step-like wave in which the rise and fall of the signal are changed in the step-like manner, the pulse generating unit 12 of the pulse pattern generator 11 includes: a basic pulse generating circuit 12a which generates a basic pulse signal having a predetermined amplitude in a predetermined bit string; a first deformation pulse generating circuit 12b1 which generates a first deformation pulse signal having a phase equal to or delayed from the basic pulse signal in the same bit string as the bit string of the basic pulse signal generated by the basic pulse generating circuit 12a; second, third, fourth, and fifth deformation pulse generating circuits 12b2, 12b3, 12b4, and 12b5 which generate second, third, fourth, and fifth deformation pulse signals each having a phase delayed by a predetermined amount from the phase of the basic pulse signal in the same bit string as the bit string of the basic pulse signal generated by the basic pulse generating circuit 12a; and a signal multiplexer 12c which outputs the pulse signal formed in the step-like wave by multiplexing the second, third, fourth, and fifth deformation pulse signals which are generated by the second, third, fourth, and fifth deformation pulse generating circuits 12b2, 12b3, 12b4, and 12b5, respectively.

The first deformation pulse generating circuit 12b1 includes: a first delay unit 12b11 which receives the basic pulse signal 21 to delay the phase of the basic pulse signal 21; and a first amplitude adjusting unit 12b12 which adjusts the amplitude of the pulse signal output from the first delay unit 12b11.

Similarly, the second deformation pulse generating circuit 12b2 includes: a second delay unit 12b21 which receives the basic pulse signal 21 to delay the phase of the basic pulse signal 21; and a second amplitude adjusting unit 12b22 which adjusts the amplitude of the pulse signal output from the second delay unit 12b21.

Similarly, the third deformation pulse generating circuit 12b3 includes: a third delay unit 12b31 which receives the basic pulse signal 21 to delay the phase of the basic pulse signal 21; and a third amplitude adjusting unit 12b32 which adjusts the amplitude of the pulse signal output from the third delay unit 12b31.

Similarly, the fourth deformation pulse generating circuit 12b4 includes: a fourth delay unit 12b41 which receives the basic pulse signal 21 to delay the phase of the basic pulse signal 21; and a fourth amplitude adjusting unit 12b42 which adjusts the amplitude of the pulse signal output from the fourth delay unit 12b41.

Similarly, the fifth deformation pulse generating circuit 12b5 includes: a fifth delay unit 12b51 which receives the basic pulse signal 21 to delay the phase of the basic pulse signal 21; and a fifth amplitude adjusting unit 12b52 which adjusts the amplitude of the pulse signal output from the fifth delay unit 12b51.

At this point, the delay amounts of the first delay unit 12b11, the second delay unit 12b21, the third delay unit 12b31, the fourth delay unit 12b41, and the fifth delay unit 12b51 are set such that the relationship of (delay amount of first delay unit 12b11)<(delay amount of second delay unit 12b21)<(delay amount of third delay unit 12b31)<(delay amount of fourth delay unit 12b41)<(delay amount of fifth delay unit 12b51) holds.

The delay amount of the first delay unit 12b11 may be set at zero, or the first delay unit 12b11 may be configured to be omitted.

The third deformation pulse generating circuit 12b3 is a reference pulse generating circuit which generates a reference pulse signal 22b that becomes the reference of the step-like wave which is formed by the multiplexing in the signal multiplexer 12c.

Accordingly, the third amplitude adjusting unit 12b32 may be configured to be omitted.

Specifically, the basic pulse generating circuit 12a generates the basic pulse signal (basic wave) 21 having the predetermined amplitude in the predetermined bit string.

The first deformation pulse generating circuit 12b1 generates a first deformation pulse signal (the phase of the reference pulse −180°) 22a1 which has a phase equal to or delayed from the basic pulse signal, and which has an amplitude of a quarter of the predetermined amplitude.

Figure 15:
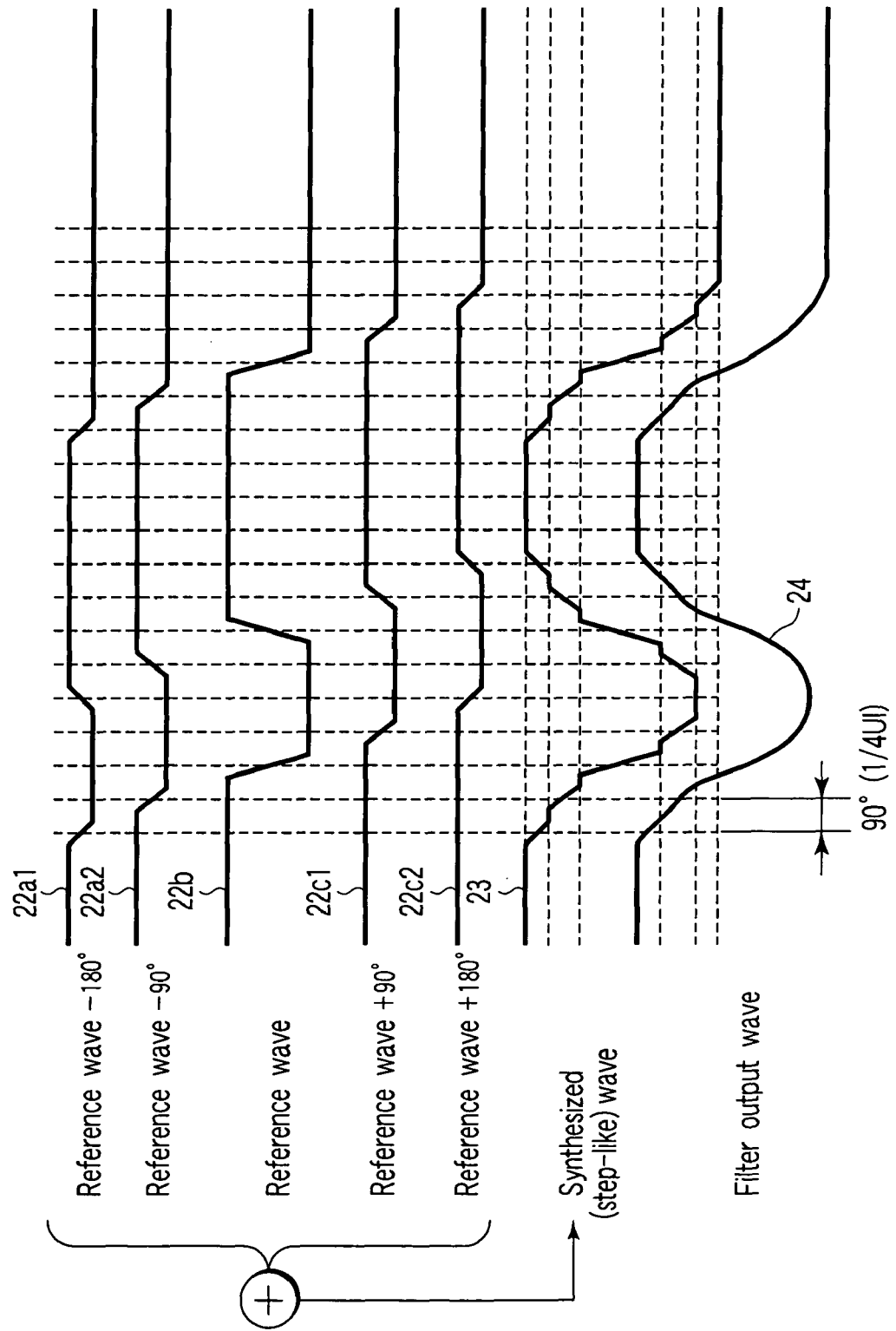
FIG. 15 is a view showing a six-level pulse signal formed in a step-like wave by the pulse generating unit shown in FIG. 14 and an output wave after the six-level pulse signal passes through the lowpass filter.

The second deformation pulse generating circuit 12b2 generates a second deformation pulse signal (the phase of the reference pulse −90°) 22a2 shown in FIG. 15, the second deformation pulse signal 22a2 having a phase delayed by a predetermined amount of 90° from the phase of the first deformation pulse signal, and having an amplitude of a half of the predetermined amplitude.

The third deformation pulse generating circuit 12b3 generates a third deformation pulse signal 22b shown in FIG. 15, the third deformation pulse signal 22b having a phase delayed by a predetermined amount of 90° from the phase of the second deformation pulse signal, and having the same amplitude as the predetermined amplitude.

That is, the third deformation pulse signal 22b is a reference pulse.

The fourth deformation pulse generating circuit 12b4 generates a fourth deformation pulse signal (the phase of the reference pulse +90°) 22c1 shown in FIG. 15, the fourth deformation pulse signal 22c1 having a phase delayed by a predetermined amount of 90° from the phase of the third deformation pulse signal, and having an amplitude of a half of the predetermined amplitude.

The fifth deformation pulse generating circuit 12b5 generates a fifth deformation pulse signal (the phase of the reference pulse +180°) 22c2 shown in FIG. 15, the fifth deformation pulse signal 22c2 having a phase delayed by a predetermined amount of 90° from the phase of the fourth deformation pulse signal, and having a amplitude of a quarter of the predetermined amplitude.

The signal multiplexer 12c outputs the pulse signal (synthesized wave) 23 formed in the step-like wave shown in FIG. 15 by multiplexing the first deformation pulse 22a1, the second deformation pulse 22a2, the third deformation pulse 22b, the fourth deformation pulse 22c1, and the fifth deformation pulse 22c2.

The pulse signal (synthesized wave) 23 formed in the step-like wave is smoothed by passing through the lowpass filter of FIG. 1, and the smoothed pulse signal is transmitted in the form of the filter output wave 24 shown in FIG. 15 to the DUT 15 and the sampling oscilloscope 17 of FIG. 1 for the purpose of the stress test of the device under test.

In this case, in order that the filter output wave 24 finally has the desired eye closure, the eye-closure setting unit 13 of FIG. 1 shall adjust the first, second, third, fourth, and fifth deformation pulse generating circuits 12b1, 12b2, 12b3, 12b4, and 12b5 of the pulse generating unit 12 through the amplitude-value setting unit 13a such that the predetermined amplitude-value relationship and the phase relationship are established among the first deformation pulse signal (the phase of the reference pulse −180°) 22a1, the second deformation pulse signal (the phase of the reference pulse −90°) 22a2, the third deformation pulse signal (reference pulse) 22b, the fourth deformation pulse signal (the phase of the reference pulse +90°) 22c1, and the fifth deformation pulse signal (the phase of the reference pulse +180°) 22c2.

When the pulse generating unit is connected to an unknown E/O converter or the like, similarly to the third embodiment, sometimes VECP is adjusted by using feedback information from the sampling oscilloscope.

Seventh Embodiment

First, a configuration of a communication device evaluation system utilizing a pulse pattern generator according to a seventh embodiment of the invention will be described with reference to FIG. 16.

The communication device evaluation system utilizing the pulse pattern generator according to the seventh embodiment is one in which a modification is made to the pulse generating unit 12 shown in FIG. 14 of the pulse pattern generator 11 according to the sixth embodiment of the invention, so that the difference from the sixth embodiment will be described below.

Figure 16:
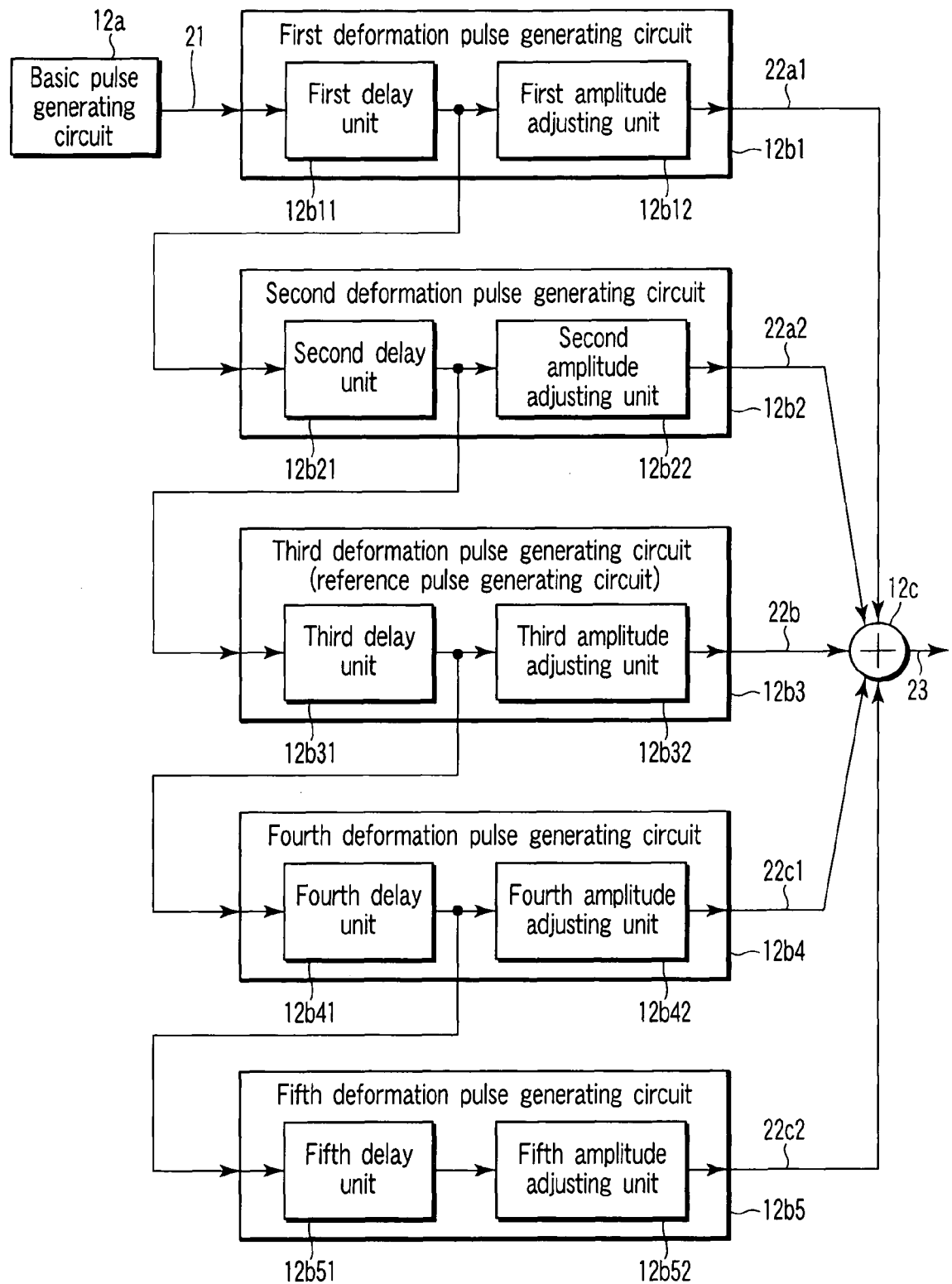
FIG. 16 is a block diagram showing a circuit configuration of a pulse generating unit in a pulse pattern generator incorporated in a communication device evaluation system according to a seventh embodiment of the present invention.

As shown in FIG. 16, the basic pulse generating circuit 12a generates the basic pulse signal (basic wave) 21 having the predetermined amplitude in the predetermined bit string.

The first deformation pulse generating circuit 12b1 generates a first deformation pulse signal (the phase of the reference pulse −180°) 22a1 which has a phase equal to or delayed from the basic pulse signal, and which has an amplitude of a quarter of the predetermined amplitude.

The second deformation pulse generating circuit 12b2 receives an output from the first delay unit 12b11 of the first deformation pulse generating circuit 12b1, and generates a second deformation pulse signal (the phase of the reference pulse −90°) 22a2 shown in FIG. 15, the second deformation pulse signal 22a2 having a phase delayed by a predetermined amount of 90° from the phase of the first deformation pulse signal, and having an amplitude of a half of the predetermined amplitude.

The third deformation pulse generating circuit 12b3 receives an output from the second delay unit 12b21 of the second deformation pulse generating circuit 12b2, and generates a third deformation pulse signal 22b shown in FIG. 15, the third deformation pulse signal 22b having a phase delayed by a predetermined amount of 90° from the phase of the second deformation pulse signal, and having the same amplitude as the predetermined amplitude.

That is, the third deformation pulse signal 22b is a reference pulse.

The fourth deformation pulse generating circuit 12b4 receives an output from the third delay unit 12b31 of the third deformation pulse generating circuit 12b3, and generates a fourth deformation pulse signal (the phase of the reference pulse +90°) 22c1 shown in FIG. 15, the fourth deformation pulse signal 22c1 having a phase delayed by a predetermined amount of 90° from the phase of the third deformation pulse signal, and having an amplitude of a half of the predetermined amplitude.

The fifth deformation pulse generating circuit 12b5 receives an output from the fourth delay unit 12b41 of the fourth deformation pulse generating circuit 12b4, and generates a fifth deformation pulse signal (the phase of the reference pulse +180°) 22c2 shown in FIG. 15, the fifth deformation pulse signal 22c2 having a phase delayed by a predetermined amount of 90° from the phase of the fourth deformation pulse signal, and having an amplitude of a quarter of the predetermined amplitude.

The signal multiplexer 12c outputs the pulse signal (synthesized wave) 23 formed in the step-like wave shown in FIG. 15 by multiplexing the first deformation pulse 22a1, the second deformation pulse 22a2, the third deformation pulse 22b, the fourth deformation pulse 22c1, and the fifth deformation pulse 22c2.

In the sixth embodiment, the delay amounts of the first delay unit 12b11, the second delay unit 12b21, the third delay unit 12b31, the fourth delay unit 12b41, and the fifth delay unit 12b51 are set such that the relationship of (delay amount of first delay unit 12b11)<(delay amount of second delay unit 12b21)<(delay amount of third delay unit 12b31)<(delay amount of fourth delay unit 12b41)<(delay amount of fifth delay unit 12b51) is established. However, in the seventh embodiment, it is not always necessary to satisfy the above relationship.

Other descriptions will be omitted because other configurations are similar to those of the sixth embodiment.

Eighth Embodiment

First, a configuration of a communication device evaluation system utilizing a pulse pattern generator according to an eighth embodiment of the invention will be described with reference to FIG. 17.

The communication device evaluation system utilizing the pulse pattern generator according to the eighth embodiment is one in which a modification is made to the pulse generating unit 12 shown in FIG. 1 of the pulse pattern generator 11 in the communication device evaluation system 10 utilizing the pulse pattern generator according to the first embodiment of the invention. Other configurations thereof are similar to those of the communication device evaluation system 10 shown in FIG. 1.

Therefore, in FIG. 17, only the pulse generating unit 12 and the lowpass filter 14 are illustrated, and the illustration will be omitted for the same configuration as in FIG. 1.

In the communication device evaluation system utilizing the pulse pattern generator according to the eighth embodiment, in order to generate the pulse signal formed in the step-like wave in which the rise and fall of the signal are changed in the step-like manner, the pulse generating unit 12 of the pulse pattern generator 11 includes: flip-flops FF1, FF2, ... cascade-connected in a plurality of stages serving as the basic pulse generating circuit 12a and the deformation pulse generating circuit 12b, a first stage being set as a master while the stages subsequent to the first stage being set as a slave, data having a predetermined data frequency being supplied to a data terminal of the first stage, a clock having a frequency double the data frequency being commonly supplied to a clock terminal of each stage, thereby, when the output from an intermediate stage is set at a reference pulse signal (reference wave), the stage precedent to the intermediate stage outputs the predetermined number of first deformation pulse signals (negative phase deformation waves) having the phases leading the phase of the reference wave by a predetermined phase amount while the stage subsequent to the intermediate stage outputs the predetermined number of second deformation pulse signals (positive phase deformation waves) having the phases delayed from the phase of the reference wave by a predetermined phase amount; amplifiers A1, A2, ... having a plurality of stages which receive outputs from each stage of the flip-flops FF1, FF2, ... cascade-connected in the plurality of stages, respectively; and a signal multiplexing unit 100 which outputs the pulse signal formed in the step-like wave by multiplexing the outputs from each stage of the amplifiers A1, A2, ... having the plurality of stages. The amplitude-value setting unit 13, 13a includes a gain setting unit 101, 102, 103 which sets gains at gain setting units 1, 2, ... of the amplifiers A1, A2, ... having the plurality of stages such that a predetermined amplitude-value relationship is established among the reference pulse signal (reference wave), the first deformation pulse signal (negative phase deformation wave), and the second deformation pulse signal (positive phase deformation wave), in order that finally the output from the lowpass filter 14 has the desired eye closure.

Specifically, in the communication device evaluation system utilizing the pulse pattern generator according to the eighth embodiment, as shown in FIG. 17, the pulse generating unit 12 of the pulse pattern generator 11 includes: the flip-flops FF1, FF2, FF3, FF4, and FF5 cascaded in the five stages; and the five-stage amplifiers A1, A2, A3, A4, and A5 which receive the outputs of the flip-flops FF1, FF2, FF3, FF4, and FF5, respectively.

In the configurations of the flip-flops FF1, FF2, FF3, FF4, and FF5 cascaded in the five stages, the flip-flop used as the master stage in a D flip-flop is used as the first-stage flip-flop FF1, and the flip-flops used as the slave stage in the D flip-flop are used as the flip-flops FF2, FF3, FF4, and FF5 subsequent to the first stage flip-flop FF1.

For example, when 10-GHz-band data is supplied to a data terminal of the first-stage flip-flop FF1, the clock having the frequency of 2×10 GHz double the data frequency is commonly supplied to the clock terminals of the flip-flops FF1, FF2, FF3, FF4, and FF5.

Accordingly, in the flip-flops FF1, FF2, FF3, FF4, and FF5 cascaded in the five stages, the data is shifted from the first stage to the last stage in each edge of the rise and fall of the clock while held in each edge of the rise and fall of the clock.

When the output from the three-stage flip-flop FF3 is set at the reference wave, the first-stage flip-flop FF1 outputs a first deformation wave having the phase relationship of reference wave −180°.

Similarly, the second-stage flip-flop FF2 outputs a second deformation wave having the phase relationship of reference wave −90°.

Similarly, the fourth-stage flip-flop FF4 outputs a third deformation wave having the phase relationship of reference wave +90°.

Similarly, the fifth-stage flip-flop FF5 outputs a fourth deformation wave having the phase relationship of reference wave +180°.

The reference wave output from the third-stage flip-flop FF3 is supplied to the third-stage amplifier A3.

The first deformation wave having the phase relationship of reference wave −180° and output from the first-stage flip-flop FF1 is supplied to the first-stage amplifier A1.

The second deformation wave having the phase relationship of reference wave −90° and output from the second-stage flip-flop FF2 is supplied to the second-stage amplifier A2.

Similarly, the third deformation wave having the phase relationship of reference wave +90° and output from the fourth-stage flip-flop FF4 is supplied to the fourth-stage amplifier A4.

Similarly, the fourth deformation wave having the phase relationship of reference wave +180° and output from the fifth-stage flip-flop FF5 is supplied to the fifth-stage amplifier A5.

That is, the reference wave and the first to fourth deformation waves are output from the amplifiers A1, A2, A3, A4, and A5, respectively, while having the phase relationship similar to that of the reference pulse signal (reference wave) 22b, the first deformation pulse signal (the phase of the reference wave −180°) 22a1, the second deformation pulse signal (the phase of the reference wave −90°) 22a2, the third deformation pulse signal (the phase of the reference wave +90°) 22c1, and the fourth deformation pulse signal (the phase of the reference wave +180°) 22c2 which are described in the fifth embodiment shown in FIG. 14.

The pulse signals 22b, 22a1, 22a2, 22c1, and 22c2 output from the amplifiers A1, A2, A3, A4, and A5, respectively, are multiplexed by the signal multiplexing unit 100 corresponding to the signal multiplexer 12c of FIG. 1, and then are smoothed by passing through the lowpass filter 14. The smoothed filter output wave 24 shown in FIG. 14 is transmitted to the DUT 15 and the sampling oscilloscope 17 of FIG. 1 for the purpose of the stress test of the device under test.

At this point, in order that the filter output wave 24 finally has the desired eye closure, the gains shall be set to gain setting units 1, 2, 3, 4, and 5 in the amplifiers A1, A2, A3, A4, and A5 through a setting unit 101, a CPU 102, and a digital/analog (D/A) converter 102 which configure the eye-closure setting unit 13 and amplitude-value setting unit 13a of FIG. 1, such that the predetermined amplitude-value relationship is established among the reference pulse signal (reference wave), the first deformation pulse signal (the phase of the reference pulse −180°) 22a1, the second deformation pulse signal (the phase of the reference pulse −90°) 22a2, the third deformation pulse signal (the phase of the reference pulse +90°) 22c1, and the fourth deformation pulse signal (the phase of the reference pulse +180°) 22c2.

Specifically, when the desired eye closure is set by the setting unit 101, in order to set the gains to the gain setting units 1, 2, 3, 4, and 5 in the amplifiers A1, A2, A3, A4, and A5, the CPU 102 computes predetermined gain setting values or reads digital data from the ROM in the CPU 102 such that the pulse signals 22b, 22a1, 22a2, 22c1, and 22c2 output from the amplifiers A1, A2, A3, A4, and A5 based on the desired setting eye closure become the predetermined amplitude values. Then, the gain setting values are output to the digital/analog (D/A) converter 103.

Similarly to the third embodiment, when the pulse generating unit is connected to an unknown E/O converter or the like, sometimes VECP can be adjusted by using feedback information from the sampling oscilloscope.

The digital/analog (D/A) converter 103 converts these items of digital data into the analog values, and sets the analog values to the gain setting units 1, 2, 3, 4, and 5 in the amplifiers A1, A2, A3, A4, and A5, respectively.

When the second-stage amplifier A2 and the fourth-stage amplifier A4 are omitted in the configuration shown in FIG. 17, the pulse signals are output from the amplifiers A1, A3, and A5 while having the phase relationship similar to that of the reference pulse signal (reference wave) 22b, the first deformation pulse signal (the phase of the reference wave −180°) 22a, and the second deformation pulse signal (the phase of the reference wave +180°) 22c in the fourth embodiment shown in FIG. 12.

Further, in the configuration in which the first-stage amplifier A1 and the fifth-stage amplifier A5 are omitted in FIG. 17, the input clock is synchronized (same scale) with the data. Consequently, the pulse signals are output from the amplifiers A2, A3, and A4 while having the phase relationship similar to that of the reference pulse signal (reference wave) 22b, the first deformation pulse signal (the phase of the reference wave −180°) 22a, and the third deformation pulse signal (the phase of the reference wave +180°) 22c in the fourth embodiment shown in FIG. 12.

Figure 18:
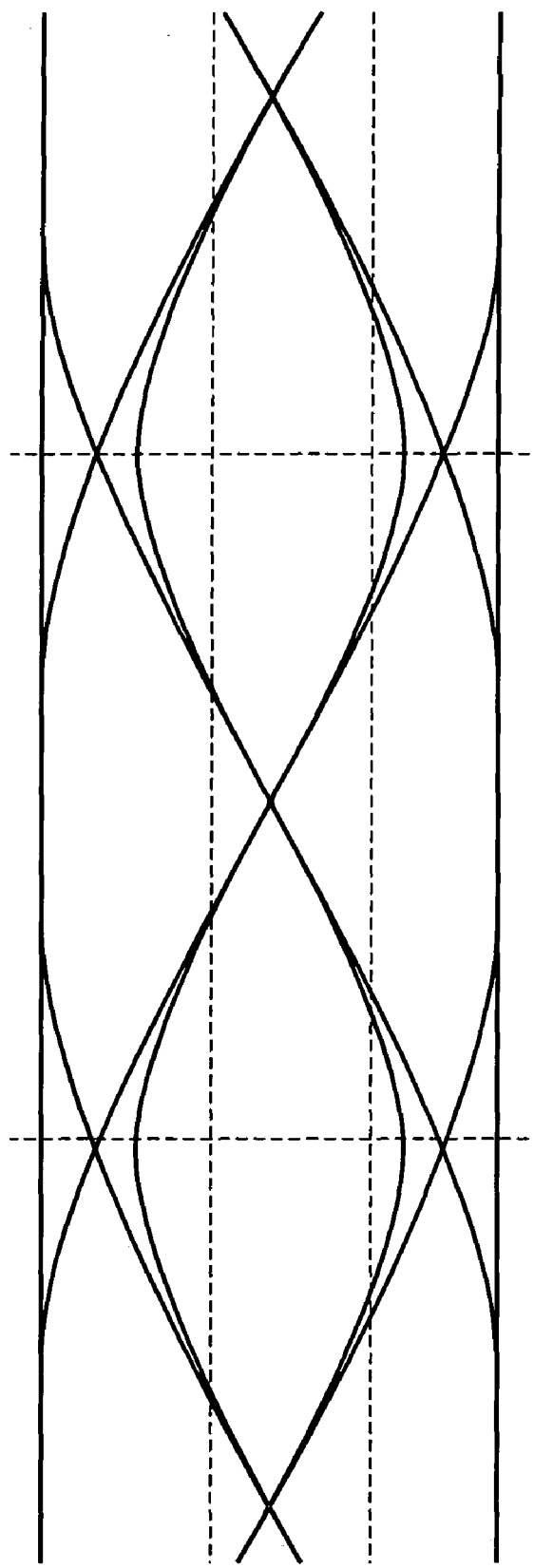
FIG. 18 is a view showing an example of an eye waveform of a six-level pulse signal formed in a step-like wave by the pulse generating unit shown in FIG. 17 after the six-level pulse signal passes through the lowpass filter.

FIG. 18 shows an eye waveform when the filter output wave 24 is observed with the sampling oscilloscope 17 of FIG. 1. The eye waveform shown in FIG. 18 has the eye closure of VECP=2.31 dB.

Figure 19:
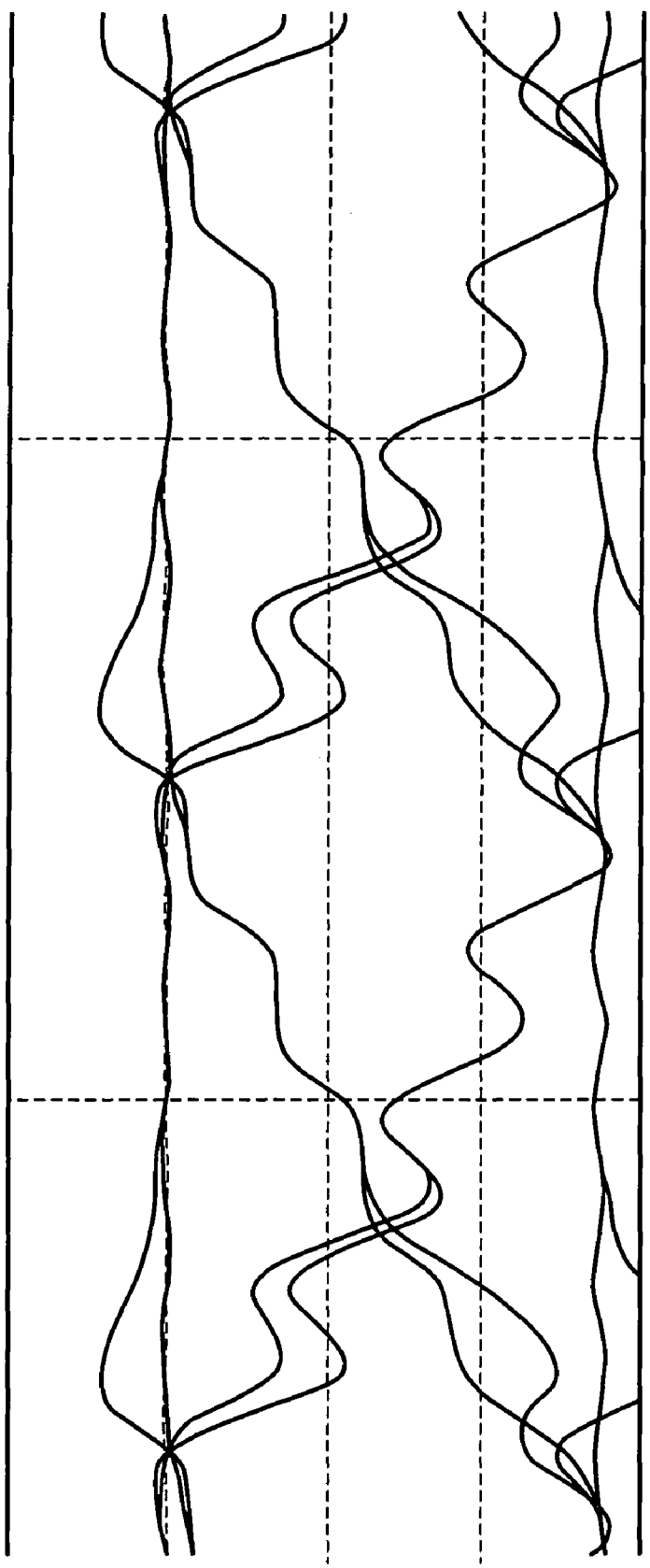
FIG. 19 is a view showing an example of an eye waveform of a six-level pulse signal formed in a step-like wave by the pulse generating unit shown in FIG. 17 before the six-level pulse signal passes through the lowpass filter.

FIG. 19 shows an eye waveform when the pulse signal (synthesized wave) 23 formed in the step-like wave is observed with the sampling oscilloscope 17 of FIG. 1 before the pulse signal 23 passes through the lowpass filter. It can easily be seen that the eye closure shown in FIG. 19 is not smoothed when compared with the eye closure of the filter output wave 24 shown in FIG. 18.

Figure 20A:
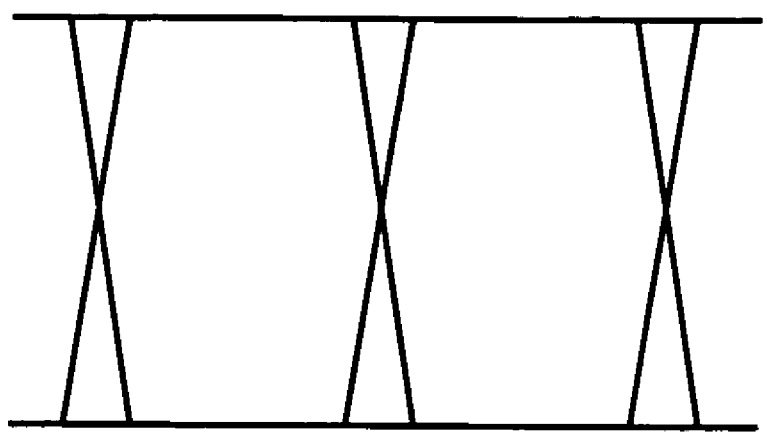
FIG. 20A is a view showing an example of high eye closure as the eye waveform obtained based on the six-level pulse signal formed in the step-like wave by the pulse generating unit shown in FIG. 17 after the six-level pulse signal passes through the lowpass filter.
Figure 20B:
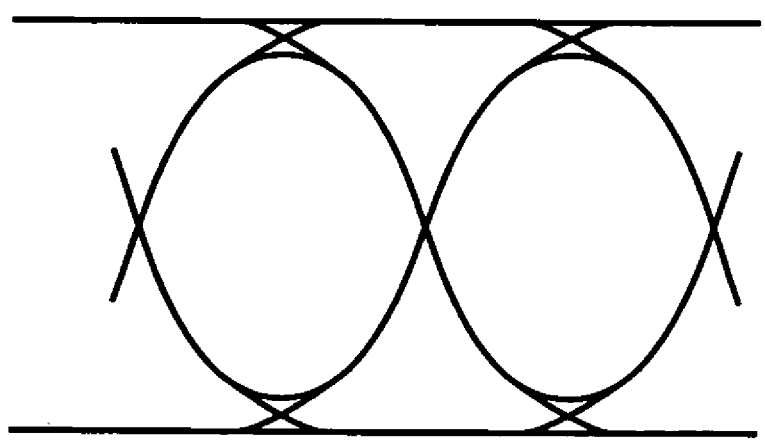
FIG. 20B is a view showing an example of low eye closure as the eye waveform obtained based on the six-level pulse signal formed in the step-like wave by the pulse generating unit shown in FIG. 17 after the six-level pulse signal passes through the lowpass filter.

FIGS. 20A and 20B show an eye waveform which is obtained by combining with the lowpass filter 14 while the amplitude-value relationship and phase relationship are adjusted between the basic wave and each deformation wave as appropriate.

That is, the eye waveform shown in FIG. 20A has the high eye closure while the eye waveform shown in FIG. 20B has the low eye closure.

The same effect as the communication device evaluation system 10 utilizing the pulse pattern generator according to the first embodiment of the present invention is obviously obtained in the communication device evaluation systems utilizing the pulse pattern generator according to the fourth to eighth embodiments.

Consequently, according to the present invention, the problems of the prior art can be solved, and there can be provided the pulse pattern generator which is improved so as to generate the pulse signal having the desired pulse pattern with the predetermined eye closure set by the pulse pattern generator in itself, and the communication device evaluation system in which the productivity can be increased by utilizing the improved pulse pattern generator for the communication device evaluation system to simplify the evaluation test for the device under test when compared with the conventional evaluation system.

INDUSTRIAL APPLICABILITY

As described above, the pulse pattern generator of the present invention and the communication device evaluation system utilizing the pulse pattern generator have the effect that the pulse signal having the desired pulse pattern having the predetermined eye closure set by the pulse pattern generator in itself can be generated, and the effect that the communication device evaluation system utilizing the pulse pattern generator can increase the productivity by simplifying the evaluation test for the device under test when compared with the conventional evaluation system. Therefore, the present invention is useful in the pulse pattern generator which generates the pulse signal for evaluating the telecommunication device, the optical communication device, or the like, the communication device evaluation system therewith, and the like.

The invention claimed is:

1. A pulse pattern generator comprising:
a pulse generating unit which generates a pulse signal formed in a step-like wave in which at least one of a rise and fall of the pulse signal is changed in a step-like manner in a predetermined bit string between first and second predetermined amplitude values to provide a step at an amplitude between the first and second predetermined amplitude values;
a lowpass filter which smooths the pulse signal formed in the step-like wave, the pulse signal being generated by the pulse generating unit, and outputs a smoothed pulse signal; and
an amplitude-value setting unit which adjusts an amplitude value of the step-like wave that forms the pulse signal based on the amplitude value, in order to set an eye waveform at a predetermined eye closure when an output from the lowpass filter is eye-patterned, wherein the pulse signal having a desired pulse pattern with the predetermined eye closure set by the amplitude-value setting unit is configured as output from the lowpass filter;
wherein the pulse generating unit includes:
a basic pulse generating unit which generates a basic pulse signal having a predetermined amplitude value in a predetermined bit string;
a deformation pulse generating unit which generates a deformation pulse signal, the deformation pulse signal having an amplitude value different from the predetermined amplitude value of the basic pulse signal and having a phase different from a phase of the basic pulse signal, in a bit string identical to the bit string of the basic pulse signal generated by the basic pulse generating unit; and
a signal multiplexing unit which outputs the pulse signal formed in the step-like wave by multiplexing the basic pulse signal generated by the basic pulse generating unit and the deformation pulse signal generated by the deformation pulse generating unit.

2. The pulse pattern generator according to claim 1, wherein the pulse generating unit includes:
a binary pulse generating circuit which generates a binary pulse signal, the binary pulse signal generating circuit serving as the basic pulse generating unit;
a one-bit delay circuit which delays the binary pulse signal output from the binary pulse signal generating circuit by one bit, and a two-bit delay circuit which delays the binary pulse signal output from the binary pulse signal generating circuit by two bits, the one-bit delay circuit and two-bit delay circuit each serving as the deformation pulse generating unit; and wherein the signal multiplexing unit outputs an eight-level pulse signal by multiplexing output signals of the binary pulse signal generating circuit, the one-bit delay circuit, and the two-bit delay circuit.

3. A pulse pattern generator comprising:

a pulse generating unit which generates a pulse signal formed in a step-like wave in which at least one of a rise and fall of the pulse signal is changed in a step-like manner in a predetermined bit string between first and second predetermined amplitude values to provide a step at an amplitude between the first and second predetermined amplitude values;

a lowpass filter which smooths the pulse signal formed in the step-like wave, the pulse signal being generated by the pulse generating unit, and outputs a smoothed pulse signal; and an amplitude-value setting unit which adjusts an amplitude value of the step-like wave that forms the pulse signal based on the amplitude value, in order to set an eye waveform at a predetermined eye closure when an output from the lowpass filter is eye-patterned, wherein the pulse signal having a desired pulse pattern with the predetermined eye closure set by the amplitude-value setting unit is configured as output from the lowpass filter;

wherein the pulse generating unit includes:
a basic pulse generating unit which generates a basic pulse signal having a predetermined amplitude value in a predetermined bit string;
a plurality of deformation pulse generating units which generate a plurality of deformation pulse signals having phases equal to or delayed from a phase of the basic pulse signal, in a bit string identical to the bit string of the basic pulse signal generated by the basic pulse generating unit; and
a signal multiplexing unit which outputs the pulse signal formed in the step-like wave by multiplexing the plurality of deformation pulse signals generated by the plurality of deformation pulse generating units.

4. The pulse pattern generator according to claim 3, wherein the plurality of deformation pulse generating units include:
a first deformation pulse generating unit which generates a first deformation pulse signal having a phase equal to or delayed from the phase of the basic pulse signal;
a second deformation pulse generating unit which generates a second deformation pulse signal having a phase delayed by a predetermined amount from the phase of the first deformation pulse signal; and
a third deformation pulse generating unit which generates a third deformation pulse signal having a phase delayed by a predetermined amount from the phase of the second deformation pulse signal.

5. The pulse pattern generator according to claim 3, wherein the plurality of deformation pulse generating units include:
a first deformation pulse generating unit which generates a first deformation pulse signal having a phase equal to or delayed from the phase of the basic pulse signal;
a second deformation pulse generating unit which generates a second deformation pulse signal having a phase delayed by a predetermined amount from the phase of the first deformation pulse signal; and a third deformation pulse generating unit which generates a third deformation pulse signal having a phase delayed by a predetermined amount from the phase of the second deformation pulse signal;

a fourth deformation pulse generating unit which generates a fourth deformation pulse signal having a phase delayed by a predetermined amount from the phase of the third deformation pulse signal; and a fifth deformation pulse generating unit which generates a fifth deformation pulse signal having a phase delayed by a predetermined amount from the phase of the fourth deformation pulse signal.

6. The pulse pattern generator according to claim 3, wherein the pulse generating unit comprises:

flip-flops cascade-connected in a plurality of stages serving as the basic pulse generating unit and the plurality of deformation pulse generating units, a first stage being set as a master while the stages subsequent to the first stage being set as a slave, data having a predetermined data frequency being supplied to a data terminal of the first stage, a clock having a frequency double the data frequency being commonly supplied to a clock terminal of each stage, thereby, when the output from an intermediate stage is set at a reference pulse signal (reference wave), the stage precedent to the intermediate stage outputs the predetermined number of first deformation pulse signals (negative phase deformation waves) having the phases leading the phase of the reference wave by a predetermined phase amount while the stage subsequent to the intermediate stage outputs the predetermined number of second deformation pulse signals (positive phase deformation waves) having the phases delayed from the phase of the reference wave by a predetermined phase amount; amplifiers having a plurality of stages which receive outputs from each stage of the flip-flops cascade-connected in the plurality of stages, respectively; and wherein the signal multiplexing unit outputs the pulse signal formed in the step-like wave by multiplexing the outputs of the amplifiers having the plurality of stages, and the amplitude-value setting unit includes a gain setting unit which sets gains at gain setting units of the amplifiers having the plurality of stages such that a predetermined amplitude-value relationship is established among the reference pulse signal (reference wave), the first deformation pulse signal (negative phase deformation wave), and the second deformation pulse signal (positive phase deformation wave), in order that finally the output from the lowpass filter has the desired eye closure.

7. A communication device evaluation system utilizing a pulse pattern generator, the pulse pattern generating comprising:

a pulse generating unit which generates a pulse signal formed in a step-like wave in which at least one of a rise and fall of the pulse signal is changed in a step-like manner in a predetermined bit string between first and second predetermined amplitude values to provide a step at an amplitude between the first and second predetermined amplitude values;

a lowpass filter which smooths the pulse signal formed in the step-like wave, the pulse signal being generated by the pulse generating unit, and outputs a smoothed pulse signal; and an amplitude-value setting unit which adjusts an amplitude value of the step-like wave that forms the pulse signal based on the amplitude value, in order to set an eye waveform at a predetermined eye closure when an output from the lowpass filter is eye-patterned, wherein the pulse signal having a desired pulse pattern with the predetermined eye closure set by the amplitude-value setting unit is configured as output from the lowpass filter, and a characteristic evaluation device which evaluates predetermined characteristics of a device under test based on the pulse signal having the desired pulse pattern with the predetermined eye closure output from the lowpass filter of the pulse pattern generator;

wherein the pulse generating unit includes:
  a basic pulse generating unit which generates a basic pulse signal having a predetermined amplitude value in a predetermined bit string;
  a deformation pulse generating unit which generates a deformation pulse signal having an amplitude value different from the predetermined amplitude value of the basic pulse signal and having a phase different from a phase of the basic pulse signal, in a bit string identical to the bit string of the basic pulse signal generated by the basic pulse generating unit; and
  a signal multiplexing unit which outputs the pulse signal formed in the step-like wave by multiplexing the basic pulse signal generated by the basic pulse generating unit and the deformation pulse signal generated by the deformation pulse generating unit.

8. The communication device evaluation system utilizing a pulse pattern generator according to claim 7, wherein the pulse generating unit of the pulse pattern generator includes:
  a binary pulse signal generating circuit which generates a binary pulse signal, the binary pulse signal generating circuit serving as the basic pulse generating unit;
  a one-bit delay circuit which delays the binary pulse signal output from the binary pulse signal generating circuit by one bit, and a two-bit delay circuit which delays the binary pulse signal output from the binary pulse signal generating circuit by two bits, the one-bit delay circuit and two-bit delay circuit each serving as the deformation pulse generating unit; and
  wherein the signal multiplexing unit outputs an eight-level pulse signal by multiplexing output signals of the binary pulse signal generating circuit, the one-bit delay circuit, and the two-bit delay circuit.

9. A communication device evaluation system utilizing a pulse pattern generator, the pulse pattern generator comprising:
  a pulse generating unit which generates a pulse signal formed in a step-like wave in which at least one of a rise and fall of the pulse signal is changed in a step-like manner in a predetermined bit string between first and second predetermined amplitude values to provide a step at an amplitude between the first and second predetermined amplitude values;
  a lowpass filter which smooths the pulse signal formed in the step-like wave, the pulse signal being generated by the pulse generating unit, and outputs a smoothed pulse signal; and
  an amplitude-value setting unit which adjusts an amplitude value of the step-like wave that forms the pulse signal based on the amplitude value, in order to set an eye waveform at a predetermined eye closure when an output from the lowpass filter is eye-patterned, wherein the pulse signal having a desired pulse pattern with the predetermined eye closure set by the amplitude-value setting unit is configured as output from the lowpass filter;

a characteristic evaluation device which evaluates predetermined characteristics of a device under test based on the pulse signal having the desired pulse pattern with the predetermined eye closure output from the lowpass filter of the pulse pattern generator, wherein the pulse generating unit includes:
  a basic pulse generating unit which generates a basic pulse signal having a predetermined amplitude value in a predetermined bit string;
  a plurality of deformation pulse generating units which generate a plurality of deformation pulse signals having phases equal to or delayed from a phase of the basic pulse signal, in a bit string identical to the bit string of the basic pulse signal generated by the basic pulse generating unit; and
  a signal multiplexing unit which outputs the pulse signal formed in the step-like wave by multiplexing the plurality of deformation pulse signals generated by the plurality of deformation pulse generating units.

10. The communication device evaluation system utilizing a pulse pattern generator according to claim 9, wherein the pulse generating unit of the pulse pattern generator includes:
  flip-flops cascade-connected in a plurality of stages serving as the basic pulse generating unit and the plurality of deformation pulse generating units, a first stage being set as a master while the stages subsequent to the first stage being set as a slave, data having a predetermined data frequency being supplied to a data terminal of the first stage, a clock having a frequency double the data frequency being commonly supplied to a clock terminal of each stage, thereby, when the output from an intermediate stage is set at a reference pulse signal (reference wave), the stage precedent to the intermediate stage outputs the predetermined number of first deformation pulse signals (negative phase deformation waves) having the phases leading the phase of the reference wave by a predetermined phase amount while the stage subsequent to the intermediate stage outputs the predetermined number of second deformation pulse signals (positive phase deformation waves) having the phases delayed from the phase of the reference wave by a predetermined phase amount;
  amplifiers having a plurality of stages which receive outputs from each stage of the flip-flops cascade-connected in the plurality of stages, respectively; and
  wherein the signal multiplexing unit outputs the pulse signal formed in the step-like wave by multiplexing the outputs from each stage of the amplifiers having the plurality of stages, wherein the amplitude-value setting unit includes a gain setting unit which sets gains at gain setting units of the amplifiers having the plurality of stages such that a predetermined amplitude-value relationship is established among the reference pulse signal (reference wave), the first deformation pulse signal (negative phase deformation wave), and the second deformation pulse signal (positive phase deformation wave), in order that finally the output from the lowpass filter has the desired eye closure.

11. The communication device evaluation system utilizing a pulse pattern generator according to claim 9, wherein the plurality of deformation pulse generating units include:
  a first deformation pulse generating unit which generates a first deformation pulse signal having a phase equal to or delayed from the phase of the basic pulse signal;

a second deformation pulse generating unit which generates a second deformation pulse signal having a phase delayed by a predetermined amount from the phase of the first deformation pulse signal; and a third deformation pulse generating unit which generates a third deformation pulse signal having a phase delayed by a predetermined amount from the phase of the second deformation pulse signal.

12. The communication device evaluation system utilizing a pulse pattern generator according to claim 9, wherein the plurality of deformation pulse generating units include:

a first deformation pulse generating unit which generates a first deformation pulse signal having a phase equal to or delayed from the phase of the basic pulse signal;

a second deformation pulse generating unit which generates a second deformation pulse signal having a phase delayed by a predetermined amount from the phase of the first deformation pulse signal; and a third deformation pulse generating unit which generates a third deformation pulse signal having a phase delayed by a predetermined amount from the phase of the second deformation pulse signal;

a fourth deformation pulse generating unit which generates a fourth deformation pulse signal having a phase delayed by a predetermined amount from the phase of the third deformation pulse signal; and a fifth deformation pulse generating unit which generates a fifth deformation pulse signal having a phase delayed by a predetermined amount from the phase of the fourth deformation pulse signal.

* * * * *